US011238826B2

United States Patent
Chen et al.

(10) Patent No.: US 11,238,826 B2
(45) Date of Patent: Feb. 1, 2022

(54) DUAL GATE LINE DRIVE CIRCUIT, ARRAY SUBSTRATE, AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Shuai Chen, Beijing (CN); Xiuzhu Tang, Beijing (CN); Zhi Zhang, Beijing (CN); Xuebo Liang, Beijing (CN); Lijun Xiong, Beijing (CN); Qiyuan Wei, Beijing (CN); Qi Li, Beijing (CN); Meiling Tan, Beijing (CN); Jinjin Chen, Beijing (CN); Huan Wang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 16/647,671

(22) PCT Filed: Apr. 1, 2019

(86) PCT No.: PCT/CN2019/080748
§ 371 (c)(1),
(2) Date: Mar. 16, 2020

(87) PCT Pub. No.: WO2020/199068
PCT Pub. Date: Oct. 8, 2020

(65) Prior Publication Data
US 2021/0256930 A1    Aug. 19, 2021

(51) Int. Cl.
*G09G 3/36* (2006.01)
*G11C 19/28* (2006.01)

(52) U.S. Cl.
CPC ......... *G09G 3/3696* (2013.01); *G09G 3/3648* (2013.01); *G11C 19/287* (2013.01);
(Continued)

(58) Field of Classification Search
None
See application file for complete search history.

(56) References Cited

U.S. PATENT DOCUMENTS

2007/0007557 A1*  1/2007  Kwak ................... G09G 3/3677
                                                      257/239
2009/0278782 A1* 11/2009  Chen .................... G09G 3/3677
                                                      345/100
(Continued)

FOREIGN PATENT DOCUMENTS

CN           1417771 A       5/2003
CN         104777936 A       7/2015
(Continued)

OTHER PUBLICATIONS

PCT International Search Report, Application No. PCT/CN2019/080748, dated Jan. 8, 2020, 6 pages: with English translation.
(Continued)

*Primary Examiner* — Chad M Dicke
(74) *Attorney, Agent, or Firm* — Armstrong Teasdale LLP

(57) ABSTRACT

The present disclosure provides a gate drive circuit, an array substrate, and a display device. The gate drive circuit includes cascaded shift registers, control circuits, level shifters, voltage stabilization circuits, and first exchanging circuits. The shift registers at respective stages output respective first signals. Each control circuit is configured to process the respective first signal to generate a respective second signal. Each level shifter is configured to convert the voltage level of the respective second signal to generate a respective third signal. Each voltage stabilization circuit is configured to stabilize the respective third signal. The stabilized third signal is outputted as a fourth signal. The first exchanging circuit is configured to enable any of the following:
(Continued)

exchanging the first signals at two adjacent stages, exchanging the second signals at two adjacent stages, exchanging the third signals at two adjacent stages, and exchanging the fourth signals at two adjacent stages.

17 Claims, 10 Drawing Sheets

(52) U.S. Cl.
CPC ............ *G09G 2300/0809* (2013.01); *G09G 2310/0286* (2013.01); *G09G 2310/0289* (2013.01)

(56) References Cited

U.S. PATENT DOCUMENTS

2012/0249493 A1* 10/2012 Chiang ................ G09G 3/3614
345/204

2012/0293762 A1* 11/2012 Shin ..................... G09G 3/3677
349/139

FOREIGN PATENT DOCUMENTS

| | | |
|---|---|---|
| CN | 106940992 A | 7/2017 |
| CN | 106960655 A | 7/2017 |
| CN | 109272950 A | 1/2019 |
| JP | 2015162257 A | 9/2015 |
| JP | 2017098813 A | 6/2017 |
| KR | 20170039115 A | 4/2017 |

OTHER PUBLICATIONS

PCT Written Opinion, Application No. PCT/CN2019/080748, dated Jan. 8, 2020, 5 pages.: with English translation of relevant part.
China First Office Action, Application No. 201980000440.8, dated Jan. 18, 2021, 38 pps.: with English translation.

* cited by examiner

DUAL GATE LINE DRIVE CIRCUIT, ARRAY SUBSTRATE, AND DISPLAY DEVICE

CROSS REFERENCE TO RELATED APPLICATIONS

This patent application is a National Stage Entry of PCT/CN2019/080748 filed on Apr. 1, 2019, the disclosure of which is incorporated by reference herein in its entirety as part of the present application.

BACKGROUND

Embodiments of the present disclosure relate to the field of display technology, and more particularly, to a gate drive circuit, an array substrate, and a display device.

Gate Driver on Array (GOA) technology makes a gate drive circuit on an array substrate, to realize the function of scanning a pixel circuit row-by-row. The gate drive circuit may output scan signal to drive the respective pixel circuit.

BRIEF DESCRIPTION

Embodiments of the present disclosure provide a gate drive circuit, an array substrate, and a display device.

A first aspect of the present disclosure provides a gate drive circuit. The gate drive circuit includes a plurality of cascaded shift registers, a plurality of control circuits, a plurality of level shifters, a plurality of voltage stabilization circuits, and a plurality of first exchanging circuits. The shift registers at respective stages output respective first signals. Each control circuit is coupled to the respective shift register, and is configured to process the respective first signal to generate a respective second signal. The effective voltage levels of the second signals are spaced apart in a time domain. Each level shifter is coupled to the respective control circuit, and is configured to convert the voltage level of the respective second signal to generate a respective third signal. Each voltage stabilization circuit is coupled to the respective level shifter, and is configured to stabilize the respective third signal. The stabilized third signal is outputted as a fourth signal. The first exchanging circuit is configured to enable any of the followings: exchanging the first signals at two adjacent stages, exchanging the second signals at two adjacent stages, exchanging the third signals at two adjacent stages, and exchanging the fourth signals at two adjacent stages.

In some embodiments of the present disclosure, the first exchanging circuit is configured to enable any of the followings: exchanging the first signals at a $2n^{th}$ stage and a $(2n+1)^{th}$ stage, exchanging the second signals at the $2n^{th}$ stage and the $(2n+1)^{th}$ stage, exchanging the third signals at the $2n^{th}$ stage and the $(2n+1)^{th}$ stage, and exchanging the fourth signals at the $2n^{th}$ stage and the $(2n+1)^{th}$ stage. Here n is a natural number.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the shift register at the $2n^{th}$ stage. A second electrode of the first transistor is coupled to an input terminal of the control circuit at the $2n^{th}$ stage. A control electrode of the second transistor is coupled to the first control signal terminal. A first electrode of the second transistor is coupled to the output terminal of the shift register at the $2n^{th}$ stage. A second electrode of the second transistor is coupled to an input terminal of the control circuit at the $(2n+1)^{th}$ stage. A control electrode of the third transistor is coupled to the first control signal terminal. A first electrode of the third transistor is coupled to an output terminal of the shift register at the $(2n+1)^{th}$ stage. A second electrode of the third transistor is coupled to the input terminal of the control circuit at the $2n^{th}$ stage. A control electrode of the fourth transistor is coupled to the first control signal terminal. A first electrode of the fourth transistor is coupled to the output terminal of the shift register at the $(2n+1)^{th}$ stage. A second electrode of the fourth transistor is coupled to the input terminal of the control circuit at the $(2n+1)^{th}$ stage.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the control circuit at the $2n^{th}$ stage. A second electrode of the first transistor is coupled to an input terminal of the level shifter at the $2n^{th}$ stage. A control electrode of the second transistor is coupled to the first control signal terminal. A first electrode of the second transistor is coupled to the output terminal of the control circuit at the $2n^{th}$ stage. A second electrode of the second transistor is coupled to an input terminal of the level shifter at the $(2n+1)^{th}$ stage. A control electrode of the third transistor is coupled to the first control signal terminal. A first electrode of the third transistor is coupled to an output terminal of the control circuit at the $(2n+1)^{th}$ stage. A second electrode of the third transistor is coupled to the input terminal of the level shifter at the $2n^{th}$ stage. A control electrode of the fourth transistor is coupled to the first control signal terminal. A first electrode of the fourth transistor is coupled to the output terminal of the control circuit at the $(2n+1)^{th}$ stage. A second electrode of the fourth transistor is coupled to the input terminal of the level shifter at the $(2n+1)^{th}$ stage.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the level shifter at the $2n^{th}$ stage. A second electrode of the first transistor is coupled to an input terminal of the voltage stabilization circuit at the $2n^{th}$ stage. A control electrode of the second transistor is coupled to the first control signal terminal. A first electrode of the second transistor is coupled to the output terminal of the level shifter at the $2n^{th}$ stage. A second electrode of the second transistor is coupled to an input terminal of the voltage stabilization circuit at the $(2n+1)^{th}$ stage. A control electrode of the third transistor is coupled to the first control signal terminal. A first electrode of the third transistor is coupled to an output terminal of the level shifter at the $(2n+1)^{th}$ stage. A second electrode of the third transistor is coupled to the input terminal of the voltage stabilization circuit at the $2n^{th}$ stage. A control electrode of the fourth transistor is coupled to the first control signal terminal. A first electrode of the fourth transistor is coupled to the output terminal of the level shifter at the $(2n+1)^{th}$ stage. A second electrode of the fourth transistor is coupled to the input terminal of the voltage stabilization circuit at the $(2n+1)^{th}$ stage.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the voltage stabilization circuit at the $2n^{th}$ stage. A second electrode of the first transistor is coupled to a $2n^{th}$ output terminal of the gate drive circuit. A control electrode of the second transistor is coupled to the first control signal terminal. A first electrode of the second transistor is coupled to the output terminal of the voltage stabilization circuit at the $2n^{th}$ stage. A second electrode of the second transistor is coupled to a $(2n+1)^{th}$ output terminal of the gate drive circuit. A control electrode of the third transistor is coupled to the first control signal terminal. A first electrode of the third transistor is coupled to an output terminal of the voltage stabilization circuit at the $(2n+1)^{th}$ stage. A second electrode of the third transistor is coupled to the $2n^{th}$ output terminal of the gate drive circuit. A control electrode of the fourth transistor is coupled to the first control signal terminal. A first electrode of the fourth transistor is coupled to the output terminal of the voltage stabilization circuit at the $(2n+1)^{th}$ stage. A second electrode of the fourth transistor is coupled to the $(2n+1)^{th}$ output terminal of the gate drive circuit.

In some embodiments of the present disclosure, the gate drive circuit further includes a plurality of second exchanging circuits. The second exchanging circuit is configured to enable any of the followings: exchanging the first signals at a $2n^{th}$ stage and a $(2n-1)^{th}$ stage, exchanging the second signals at the $2n^{th}$ stage and the $(2n-1)^{th}$ stage, exchanging the third signals at the $2n^{th}$ stage and the $(2n-1)^{th}$ stage, and exchanging the fourth signals at the $2n^{th}$ stage and the $(2n-1)^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the control circuit at the $(2n-1)^{th}$ stage. A second electrode of the fifth transistor is coupled to an input terminal of the level shifter at the $(2n-1)^{th}$ stage. A control electrode of the sixth transistor is coupled to the second control signal terminal. A first electrode of the sixth transistor is coupled to the output terminal of the control circuit at the $(2n-1)^{th}$ stage. A second electrode of the sixth transistor is coupled to an input terminal of the level shifter at the $2n^{th}$ stage. A control electrode of the seventh transistor is coupled to the second control signal terminal. A first electrode of the seventh transistor is coupled to an output terminal of the control circuit at the $2n^{th}$ stage. A second electrode of the seventh transistor is coupled to the input terminal of the level shifter at the $(2n-1)^{th}$ stage. A control electrode of the eighth transistor is coupled to the second control signal terminal. A first electrode of the eighth transistor is coupled to the output terminal of the control circuit at the $2n^{th}$ stage. A second electrode of the eighth transistor is coupled to the input terminal of the level shifter at the $2n^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the shift register at the $(2n-1)^{th}$ stage. A second electrode of the fifth transistor is coupled to an input terminal of the control circuit at the $(2n-1)^{th}$ stage. A control electrode of the sixth transistor is coupled to the second control signal terminal. A first electrode of the sixth transistor is coupled to the output terminal of the shift register at the $(2n-1)^{th}$ stage. A second electrode of the sixth transistor is coupled to an input terminal of the control circuit at the $2n^{th}$ stage. A control electrode of the seventh transistor is coupled to the second control signal terminal. A first electrode of the seventh transistor is coupled to an output terminal of the shift register at the $2n^{th}$ stage. A second electrode of the seventh transistor is coupled to the input terminal of the control circuit at the $(2n-1)^{th}$ stage. A control electrode of the eighth transistor is coupled to the second control signal terminal. A first electrode of the eighth transistor is coupled to the output terminal of the shift register at the $2n^{th}$ stage. A second electrode of the eighth transistor is coupled to the input terminal of the control circuit at the $2n^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the level shifter at the $(2n-1)^{th}$ stage. A second electrode of the fifth transistor is coupled to an input terminal of the voltage stabilization circuit at the $(2n-1)^{th}$ stage. A control electrode of the sixth transistor is coupled to the second control signal terminal. A first electrode of the sixth transistor is coupled to the output terminal of the level shifter at the $(2n-1)^{th}$ stage. A second electrode of the sixth transistor is coupled to an input terminal of the voltage stabilization circuit at the $2n^{th}$ stage. A control electrode of the seventh transistor is coupled to the second control signal terminal. A first electrode of the seventh transistor is coupled to an output terminal of the level shifter at the $2n^{th}$ stage. A second electrode of the seventh transistor is coupled to the input terminal of the voltage stabilization circuit at the $(2n-1)^{th}$ stage. A control electrode of the eighth transistor is coupled to the second control signal terminal. A first electrode of the eighth transistor is coupled to the output terminal of the level shifter at the $2n^{th}$ stage. A second electrode of the eighth transistor is coupled to the input terminal of the voltage stabilization circuit at the $2n^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the voltage stabilization circuit at the $(2n-1)^{th}$ stage. A second electrode of the fifth transistor is coupled to a $(2n-1)^{th}$ output terminal of the gate drive circuit. A control electrode of the sixth transistor is coupled to the second control signal terminal. A first electrode of the sixth transistor is coupled to the output terminal of the voltage stabilization circuit at the $(2n-1)^{th}$ stage. A second electrode of the sixth transistor is coupled to a $2n^{th}$ output terminal of the gate drive circuit. A control electrode of the seventh transistor is coupled to the second control signal terminal. A first electrode of the seventh transistor is coupled to an output terminal of the voltage stabilization circuit at the $2n^{th}$ stage. A second electrode of the seventh transistor is coupled to the $(2n-1)^{th}$ output terminal of the gate drive circuit. A control electrode of the eighth transistor is coupled to the second control signal terminal. A first electrode of the eighth transistor is coupled to the output terminal of the voltage stabilization circuit at the $2n^{th}$ stage. A second electrode of the eighth transistor is coupled to the $2n^{th}$ output terminal of the gate drive circuit.

In some embodiments of the present disclosure, the first exchanging circuit is configured to enable any of the followings: exchanging the first signals at a $2n^{th}$ stage and a $(2n-1)^{th}$ stage, exchanging the second signals at the $2n^{th}$ stage and the $(2n-1)^{th}$ stage, exchanging the third signals at the $2n^{th}$ stage and the $(2n-1)^{th}$ stage, and exchanging the fourth signals at the $2n^{th}$ stage and the $(2n-1)^{th}$ stage. Here n is a natural number.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the shift register at the $(2n-1)^{th}$ stage. A second electrode of the first transistor is coupled to an input terminal of the control circuit at the $(2n-1)^{th}$ stage. A control electrode of the second transistor is coupled to the first control signal terminal. A first electrode of the second transistor is coupled to the output terminal of the shift register at the $(2n-1)^{th}$ stage. A second electrode of the second transistor is coupled to an input terminal of the control circuit at the $2n^{th}$ stage. A control electrode of the third transistor is coupled to the first control signal terminal. A first electrode of the third transistor is coupled to an output terminal of the shift register at the $2n^{th}$ stage. A second electrode of the third transistor is coupled to the input terminal of the control circuit at the $(2n-1)^{th}$ stage. A control electrode of the fourth transistor is coupled to the first control signal terminal. A first electrode of the fourth transistor is coupled to the output terminal of the shift register at the $2n^{th}$ stage. A second electrode of the fourth transistor is coupled to the input terminal of the control circuit at the $2n^{th}$ stage.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the control circuit at the $(2n-1)^{th}$ stage. A second electrode of the first transistor is coupled to an input terminal of the level shifter at the $(2n-1)^{th}$ stage. A control electrode of the second transistor is coupled to the first control signal terminal. A first electrode of the second transistor is coupled to the output terminal of the control circuit at the $(2n-1)^{th}$ stage. A second electrode of the second transistor is coupled to an input terminal of the level shifter at the $2n^{th}$ stage. A control electrode of the third transistor is coupled to the first control signal terminal. A first electrode of the third transistor is coupled to an output terminal of the control circuit at the $2n^{th}$ stage. A second electrode of the third transistor is coupled to the input terminal of the level shifter at the $(2n-1)^{th}$ stage. A control electrode of the fourth transistor is coupled to the first control signal terminal. A first electrode of the fourth transistor is coupled to the output terminal of the control circuit at the $2n^{th}$ stage. A second electrode of the fourth transistor is coupled to the input terminal of the level shifter at the $2n^{th}$ stage.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the level shifter at the $(2n-1)^{th}$ stage. A second electrode of the first transistor is coupled to an input terminal of the voltage stabilization circuit at the $(2n-1)^{th}$ stage. A control electrode of the second transistor is coupled to the first control signal terminal. A first electrode of the second transistor is coupled to the output terminal of the level shifter at the $(2n-1)^{th}$ stage. A second electrode of the second transistor is coupled to an input terminal of the voltage stabilization circuit at the $2n^{th}$ stage. A control electrode of the third transistor is coupled to the first control signal terminal. A first electrode of the third transistor is coupled to an output terminal of the level shifter at the $2n^{th}$ stage. A second electrode of the third transistor is coupled to the input terminal of the voltage stabilization circuit at the $(2n-1)^{th}$ stage. A control electrode of the fourth transistor is coupled to the first control signal terminal. A first electrode of the fourth transistor is coupled to the output terminal of the level shifter at the $2n^{th}$ stage. A second electrode of the fourth transistor is coupled to the input terminal of the voltage stabilization circuit at the $2n^{th}$ stage.

In some embodiments of the present disclosure, the first exchanging circuit includes a first transistor, a second transistor, a third transistor, and a fourth transistor. A control electrode of the first transistor is coupled to a first control signal terminal. A first electrode of the first transistor is coupled to an output terminal of the voltage stabilization circuit at the $(2n-1)^{th}$ stage. A second electrode of the first transistor is coupled to a $(2n-1)^{th}$ output terminal of the gate drive circuit. A control electrode of the second transistor is coupled to the first control signal terminal. A first electrode of the second transistor is coupled to the output terminal of the voltage stabilization circuit at the $(2n-1)^{th}$ stage. A second electrode of the second transistor is coupled to a $2n^{th}$ output terminal of the gate drive circuit. A control electrode of the third transistor is coupled to the first control signal terminal. A first electrode of the third transistor is coupled to an output terminal of the voltage stabilization circuit at the $2n^{th}$ stage. A second electrode of the third transistor is coupled to the $(2n-1)^{th}$ output terminal of the gate drive circuit. A control electrode of the fourth transistor is coupled to the first control signal terminal. A first electrode of the fourth transistor is coupled to the output terminal of the voltage stabilization circuit at the $2n^{th}$ stage. A second electrode of the fourth transistor is coupled to the $2n^{th}$ output terminal of the gate drive circuit.

In some embodiments of the present disclosure, the gate drive circuit further includes a plurality of second exchanging circuits. The second exchanging circuit is configured to enable any of the followings: exchanging the first signals at a $2n^{th}$ stage and a $(2n+1)^{th}$ stage, exchanging the second signals at the $2n^{th}$ stage and the $(2n+1)^{th}$ stage, exchanging the third signals at the $2n^{th}$ stage and the $(2n+1)^{th}$ stage, and exchanging the fourth signals at the $2n^{th}$ stage and the $(2n+1)^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the control circuit at the $2n^{th}$ stage. A second electrode of the fifth transistor is coupled to an input terminal of the level shifter at the $2n^{th}$ stage. A control electrode of the sixth transistor is coupled to the second control signal terminal. A first electrode of the sixth transistor is coupled to the output terminal of the control circuit at the $2n^{th}$ stage. A second electrode of the sixth transistor is coupled to an input terminal of the level shifter at the $(2n+1)^{th}$ stage. A control electrode of the seventh transistor is coupled to the second control signal terminal. A first electrode of the seventh transistor is coupled to an output terminal of the control circuit at the $(2n+1)^{th}$ stage. A second electrode of the seventh transistor is coupled to the input terminal of the level shifter at the $2n^{th}$ stage. A control electrode of the eighth transistor is coupled to the second control signal terminal. A first electrode of the eighth transistor is coupled to the output terminal of the control circuit at the $(2n+1)^{th}$ stage. A second electrode of the eighth transistor is coupled to the input terminal of the level shifter at the $(2n+1)^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the shift register at the $2n^{th}$ stage. A second electrode of the fifth transistor is coupled to an input terminal of the control circuit at the $2n^{th}$ stage. A control electrode of the sixth transistor is coupled to the second control signal terminal. A first electrode of the sixth transistor is coupled to the output terminal of the shift register at the $2n^{th}$ stage. A second electrode of the sixth transistor is coupled to an input terminal of the control circuit at the $(2n+1)^{th}$ stage. A control electrode of the seventh transistor is coupled to the second control signal terminal. A first electrode of the seventh transistor is coupled to an output terminal of the shift register at the $(2n+1)^{th}$ stage. A second electrode of the seventh transistor is coupled to the input terminal of the control circuit at the $2n^{th}$ stage. A control electrode of the eighth transistor is coupled to the second control signal terminal. A first electrode of the eighth transistor is coupled to the output terminal of the shift register at the $(2n+1)^{th}$ stage. A second electrode of the eighth transistor is coupled to the input terminal of the control circuit at the $(2n+1)^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the level shifter at the $2n^{th}$ stage. A second electrode of the fifth transistor is coupled to an input terminal of the voltage stabilization circuit at the $2n^{th}$ stage. A control electrode of the sixth transistor is coupled to the second control signal terminal. A first electrode of the sixth transistor is coupled to the output terminal of the level shifter at the $2n^{th}$ stage. A second electrode of the sixth transistor is coupled to an input terminal of the voltage stabilization circuit at the $(2n+1)^{th}$ stage. A control electrode of the seventh transistor is coupled to the second control signal terminal. A first electrode of the seventh transistor is coupled to an output terminal of the level shifter at the $(2n+1)^{th}$ stage. A second electrode of the seventh transistor is coupled to the input terminal of the voltage stabilization circuit at the $2n^{th}$ stage. A control electrode of the eighth transistor is coupled to the second control signal terminal. A first electrode of the eighth transistor is coupled to the output terminal of the level shifter at the $(2n+1)^{th}$ stage. A second electrode of the eighth transistor is coupled to the input terminal of the voltage stabilization circuit at the $(2n+1)^{th}$ stage.

In some embodiments of the present disclosure, the second exchanging circuit includes a fifth transistor, a sixth transistor, a seventh transistor, and an eighth transistor. A control electrode of the fifth transistor is coupled to a second control signal terminal. A first electrode of the fifth transistor is coupled to an output terminal of the voltage stabilization circuit at the $2n^{th}$ stage. A second electrode of the fifth transistor is coupled to a $2n^{th}$ output terminal of the gate drive circuit. A control electrode of the sixth transistor is coupled to the second control signal terminal. A first electrode of the sixth transistor is coupled to the output terminal of the voltage stabilization circuit at the $2n^{th}$ stage. A second electrode of the sixth transistor is coupled to a $(2n+1)^{th}$ output terminal of the gate drive circuit. A control electrode of the seventh transistor is coupled to the second control signal terminal. A first electrode of the seventh transistor is coupled to an output terminal of the voltage stabilization circuit at the $(2n+1)^{th}$ stage. A second electrode of the seventh transistor is coupled to the $2n^{th}$ output terminal of the gate drive circuit. A control electrode of the eighth transistor is coupled to the second control signal terminal. A first electrode of the eighth transistor is coupled to the output terminal of the voltage stabilization circuit at the $(2n+1)^{th}$ stage. A second electrode of the eighth transistor is coupled to the $(2n+1)^{th}$ output terminal of the gate drive circuit.

In some embodiments of the present disclosure, the first transistor and the fourth transistor are N-type transistors, and the second transistor and the third transistor are P-type transistors.

In some embodiments of the present disclosure, the first transistor and the fourth transistor are P-type transistors, and the second transistor and the third transistor are N-type transistors.

In some embodiments of the present disclosure, the fifth transistor and the eighth transistor are N-type transistors, and the sixth transistor and the seventh transistor are P-type transistors.

In some embodiments of the present disclosure, the fifth transistor and the eighth transistor are P-type transistors, and the sixth transistor and the seventh transistor are N-type transistors.

A second aspect of the present disclosure provides an array substrate including the gate drive circuit as described above.

A third aspect of the present disclosure provides a display device including the array substrate as described above.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

In the drawings, the reference numbers having the same last two-digit correspond to the same elements. It should be noted that the elements in the drawings are schematic and not drawn to scale.

DETAILED DESCRIPTION

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an a P-type transistor. Therefore, in the embodiments of the present disclosure, a controlled intermediate terminal of the transistor is referred to as a control electrode, and the remaining two terminals are referred to as a first electrode and a second electrode. In addition, terms such as "first" and "second" are only used to distinguish one element (or a part of the element) from another element (or another part of this element).

Figure 1A:
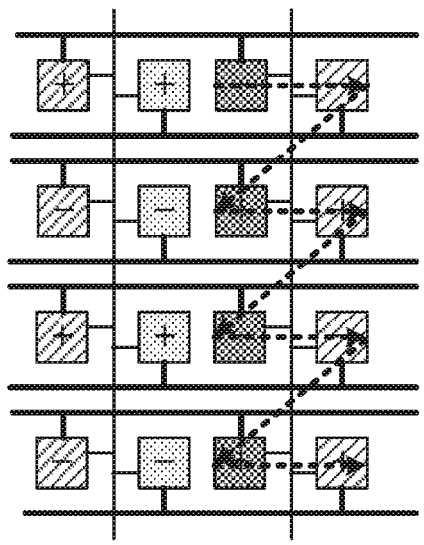
FIGS. 1A and 1B are schematic diagrams illustrating the architectures of two kinds of array substrates.
Figure 1B:
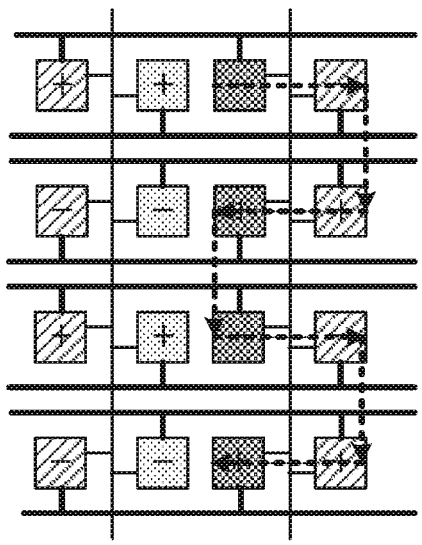

With the continuous development of display technology, duel gate line array substrates are widely used in display panels as low-cost array substrates. FIGS. 1A and 1B show the architectures of two kinds of dual gate line array substrates. As shown in FIGS. 1A and 1B, on a duel gate line array substrate, two gate lines are arranged between every two adjacent sub-pixel rows, and one data line is shared by every two sub-pixel columns. By sequentially providing scan signals to the gate lines, the respective sub-pixels sharing the same data line are sequentially turned on in the order as shown in FIGS. 1A and 1B. In the array substrate as shown in FIG. 1A, the third sub-pixel at the first row is connected to the gate line at the first row, the fourth sub-pixel at the first row is connected to the gate line at the second row, the third sub-pixel at the second row is connected to the gate line at the third row, and the fourth sub-pixel at the second row is connected to the gate line at the fourth row. Therefore, the respective sub-pixels sharing the same data line are sequentially turned on in the order as a letter "Z". In the array substrate as shown in FIG. 1B, the third sub-pixel at the first row is connected to the gate line at the first row, the fourth sub-pixel at the first row is connected to the gate line at the second row, the third sub-pixel at the second row is connected to the gate line at the fourth row, and the fourth sub-pixel at the second row is connected to the gate line at the third row. Therefore, the respective sub-pixels sharing the same data line is sequentially turned on in the order as a shape of "⊇".

Figure 2:
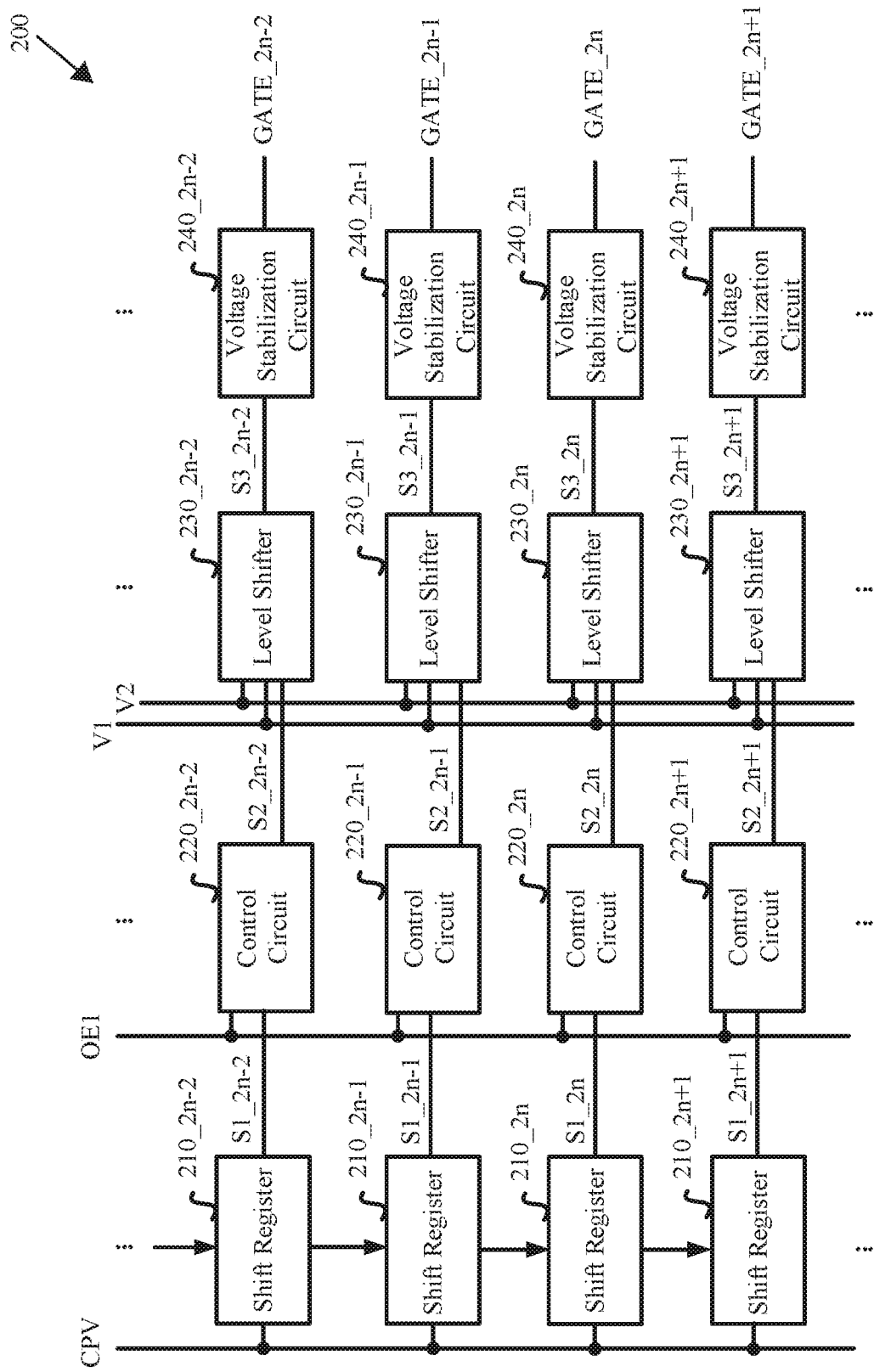
FIG. 2 is a schematic block diagram of a gate drive circuit.

FIG. 2 shows a schematic block diagram of a gate drive circuit 200 that can be used to provide scan signals to the above two kinds of array substrates. As shown in FIG. 2, the gate drive circuit 200 includes a plurality of cascaded shift registers ( . . . , 210_2n−2, 210_2n−1, 210_2n, 210_2n+1, . . . , hereinafter may be referred to as 210), a plurality of control circuits ( . . . , 220_2n−2, 220_2n−1, 220_2n, 220_2n+1, . . . , hereinafter may be referred to as 220), a plurality of level shifters ( . . . , 230_2n−2, 230_2n−1, 230_2n, 230_2n+1, . . . , hereinafter may be referred to as 230) and a plurality of voltage stabilization circuits ( . . . , 240_2n−2, 240_2n−1, 240_2n, 240_2n+1, . . . , hereinafter may be referred to as 240).

The shift registers 210 at respective stages are coupled to a clock signal terminal CPV and respective control circuits 220. Each shift register 210 outputs a first signal ( . . . , S1_2n−2, S1_2n−1, S1_2n, S1_2n+1, . . . , hereinafter may be referred to as S1) from its output terminal under the control of a clock signal CPV from a clock signal terminal CPV. An input terminal of the shift register 210_2n at a $2n^{th}$ stage is coupled to an output terminal of the shift register 210_2n−1 at a $(2n-1)^{th}$ stage. Therefore, the first signal outputted from the shift register 210_2n−1 at the $(2n-1)^{th}$ stage is used as an input signal of the shift register 210_2n at the $2n^{th}$ stage. An output terminal of the shift register 210_2n at the $2n^{th}$ stage is coupled to an input terminal of the shift register 210_2n+1 at the $(2n+1)^{th}$ stage. Therefore, the first signal outputted from the shift register 210_2n at the $2n^{th}$ stage is used as an input signal of the shift register 210_2n+1 at the $(2n+1)^{th}$ stage.

Each control circuit 220 is coupled to a control signal terminal OE1, the respective shift register 210, and a respective level shifter 230, and is configured to process the respective first signal S1 to generate a respective second signal ( . . . , S2_2n−2, S2_2n−1, S2_2n, S2_2n+1, hereinafter may be referred to as S2). The control circuits 220 may process the first signals S1 by applying a window based on a control signal OE1 from the control signal terminal OE1, such that the effective voltage levels of the generated second signals S2 are spaced apart in a time domain. The control circuit 220 may include an AND gate. An input terminal of the AND gate is coupled to the control signal terminal OE1. The other input terminal of the AND gate is coupled to an output terminal of the respective shift register 210. An output terminal of the AND gate is coupled to an input terminal of the respective level shifter 230.

Each level shifter 230 is coupled to a first voltage terminal V1, a second voltage terminal V2, the respective control circuit 220, and a respective voltage stabilization circuit 240, and is configured to convert the voltage level of the respective second signal S2 to generate a respective third signal ( . . . , S3_2n−2, S3_2n−1, S3_2n, S3_2n+1, . . . , hereinafter may be referred to as S3). The first voltage terminal V1 provides a first voltage. The second voltage terminal V2 provides a second voltage. When the second signal S2 is at a high voltage level, the level shifter 230 converts the second signal S2 into a third signal S3 having a first voltage. When the second signal S2 is at a low voltage level, the level shifter 230 converts the second signal S2 into a third signal S3 having a second voltage. To meet industrial requirements, the value of the first voltage may be greater than the value of the high voltage level of the second signal S2, for example. The value of the second voltage may be smaller than the value of the low voltage level of the second signal S2.

Each voltage stabilization circuit 240 is coupled to the respective level shifter 230 and is configured to stabilize the respective third signal S3. The voltage stabilizing circuit 240 can stabilize the amplitude of the voltage outputted from the gate drive circuit 200 when the gate drive circuit 200 is with load. The stabilized third signal is outputted as a gate drive signal (hereinafter referred to as a "fourth signal") ( . . . , GATE_2n−2, GATE_2n−1, GATE_2n, GATE_2n+1, . . . , hereinafter may be referred to as GATE) to be provided to the respective pixel circuit. In the art, the voltage stabilization circuit 240 may also be referred to as an output buffer.

Figure 3:
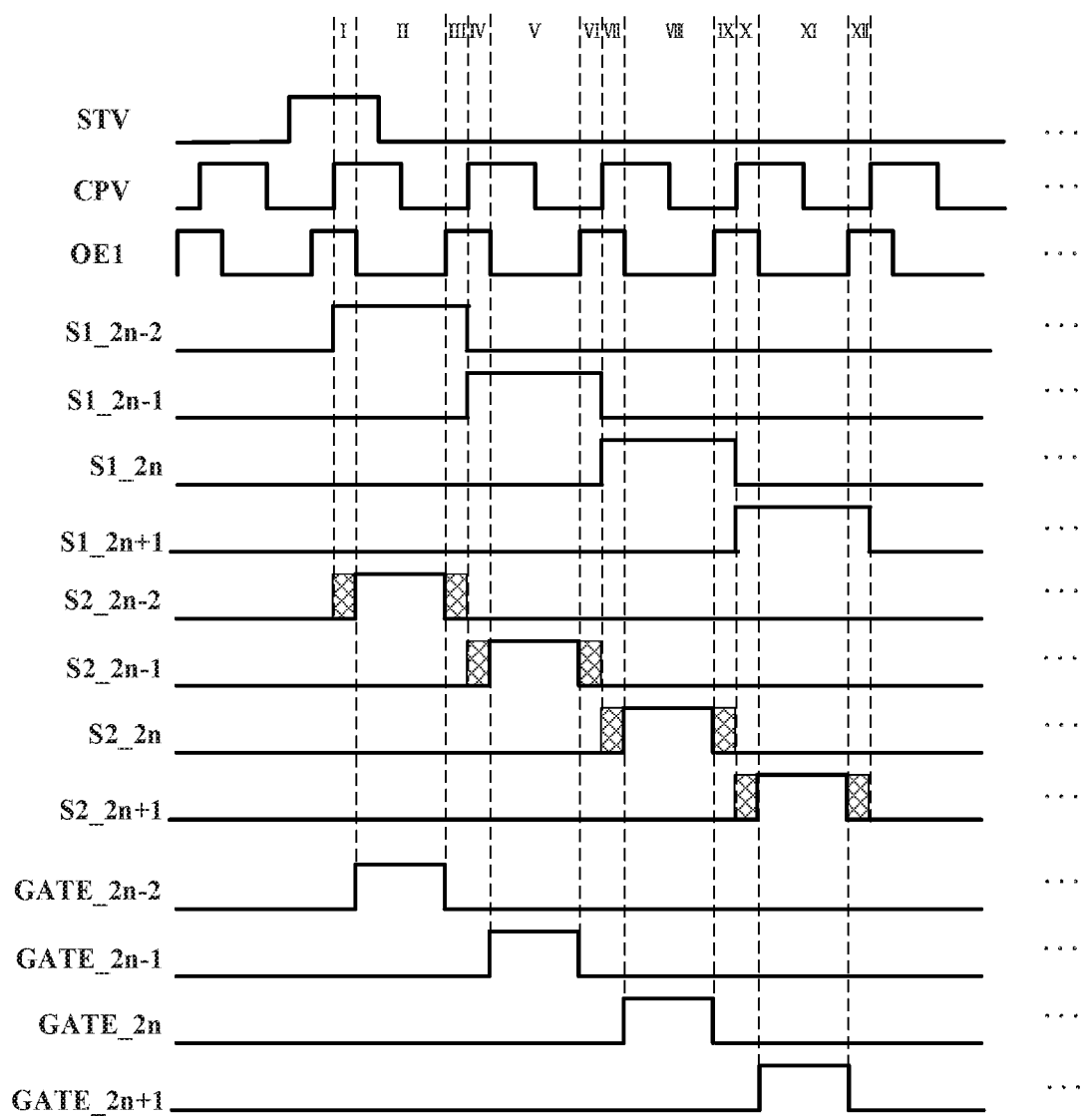
FIG. 3 is a timing diagram of some signals for the gate drive circuit as shown in FIG. 2.

FIG. 3 exemplarily shows an example of a timing diagram of some signals for the gate drive circuit 200 as shown in FIG. 2. As shown in FIG. 3, the first signal S1_2n−2 at the $(2n-2)^{th}$ stage is at the high voltage level (effective voltage level) during the phases I to III. The first signal S1_2n−1 at the $(2n-1)^{th}$ stage is at the high voltage level during the phases IV to VI. The first signal S1_2n at the $2n^{th}$ stage is at the high voltage level from the phases VII to IX. The first signal S1_2n+1 at the $(2n+1)^{th}$ stage is at the high voltage level during the phases X to XII. As can be seen from FIG. 3, the effective voltage levels outputted from adjacent shift registers are closely adjacent in the time domain. When the thin film transistor TFT of the pixel circuit is actually under control, there may be a phenomenon in which the gates of TFTs at two rows are opened at the same time due to a delay. This will cause a collision of data for pixels at two rows.

In the example of FIG. 2, the control circuit 220 enables the second signal S2 to be at the high voltage level (effective voltage level) only when the control signal OE1 is at the low voltage level and the first signal S1 is at the high voltage level. For example, the second signal S2_2n−2 at the $(2n-2)^{th}$ stage is at the high voltage level only in the phase II. The second signal S2_2n−1 at the $(2n-1)^{th}$ stage is at the high voltage level only in the phase V. The second signal S2_2n at the $2n^{th}$ stage is at the high voltage level only in the phase VIII. The second signal S2_2n+1 at the $(2n+1)^{th}$ stage is at the high voltage level only in the phase XI. The shaded areas in FIG. 3 indicates that the effective voltage level of the first signal S1 is masked at this phase, and therefore, the second signal S2 is ineffective at this phase. In this way, the effective voltage levels of the second signals S2 at the respective stages are spaced apart in the time domain, thereby avoiding collision of data for pixels at two rows.

The third signal S3 (not shown in FIG. 3) is generated, by the level shifter 230, by converting voltage level of the respective second signal S2, and it is different from the second signal S2 only in the amplitude. The fourth signal GATE is obtained by stabilizing the third signal S3. As shown in FIG. 3, the effective voltage level of the fourth signal GATE_2n−2 at the $(2n-2)^{th}$ stage aligns with the effective voltage level of the second signal S2_2n−2 at the $(2n-2)^{th}$ stage in the time domain. The effective voltage level of the fourth signal GATE_2n−1 at the $(2n-1)^{th}$ stage aligns with the effective voltage level of the second signal S2_2n−1 at the $(2n-1)^{th}$ stage in the time domain. The effective voltage level of the fourth signal GATE_2n at the $2n^{th}$ stage aligns with the effective voltage level of the second signal S2_2n at the $2n^{th}$ stage in the time domain. The effective voltage level of the fourth signal GATE_2n+1 at the $(2n+1)^{th}$ stage aligns with the effective voltage level of the second signal S2_2n+1 at the $(2n+1)^{th}$ stage in the time domain. In this way, the fourth signals GATE at the respective stages are sequentially at the effective voltage level.

In a liquid crystal display device, the polarities of the voltage differences (i.e., the polarities of the data signals) applied to the liquid crystal molecules usually need to be reversed at regular time intervals, so as to avoid permanent damage to the liquid crystal material due to polarization, and also to avoid the phenomenon of image residual. Usually, a 2Dot-Inversion approach is used to reverse the polarity of the voltage difference on the liquid crystal molecule. In the case of using the 2Dot-Inversion approach, for the "Z"-shaped architecture, the red pixels and the blue pixels may be undercharged. For the "ᒿ"-shaped architecture, the red pixels, green pixels, and blue pixels may be all undercharged. Therefore, the styles of the pictures displayed by the display devices using these two architectures will be different. Different users may like different styles. In order to meet the needs of different users, producing display devices having two architectures will increase the development costs.

Therefore, the embodiments of the present disclosure propose to change the lighting order of the sub-pixels by exchanging the waveforms of the scan signals at adjacent rows without changing the hardware architecture of the display device. Specific implementations according to embodiments of the present disclosure are described below.

Figure 4:
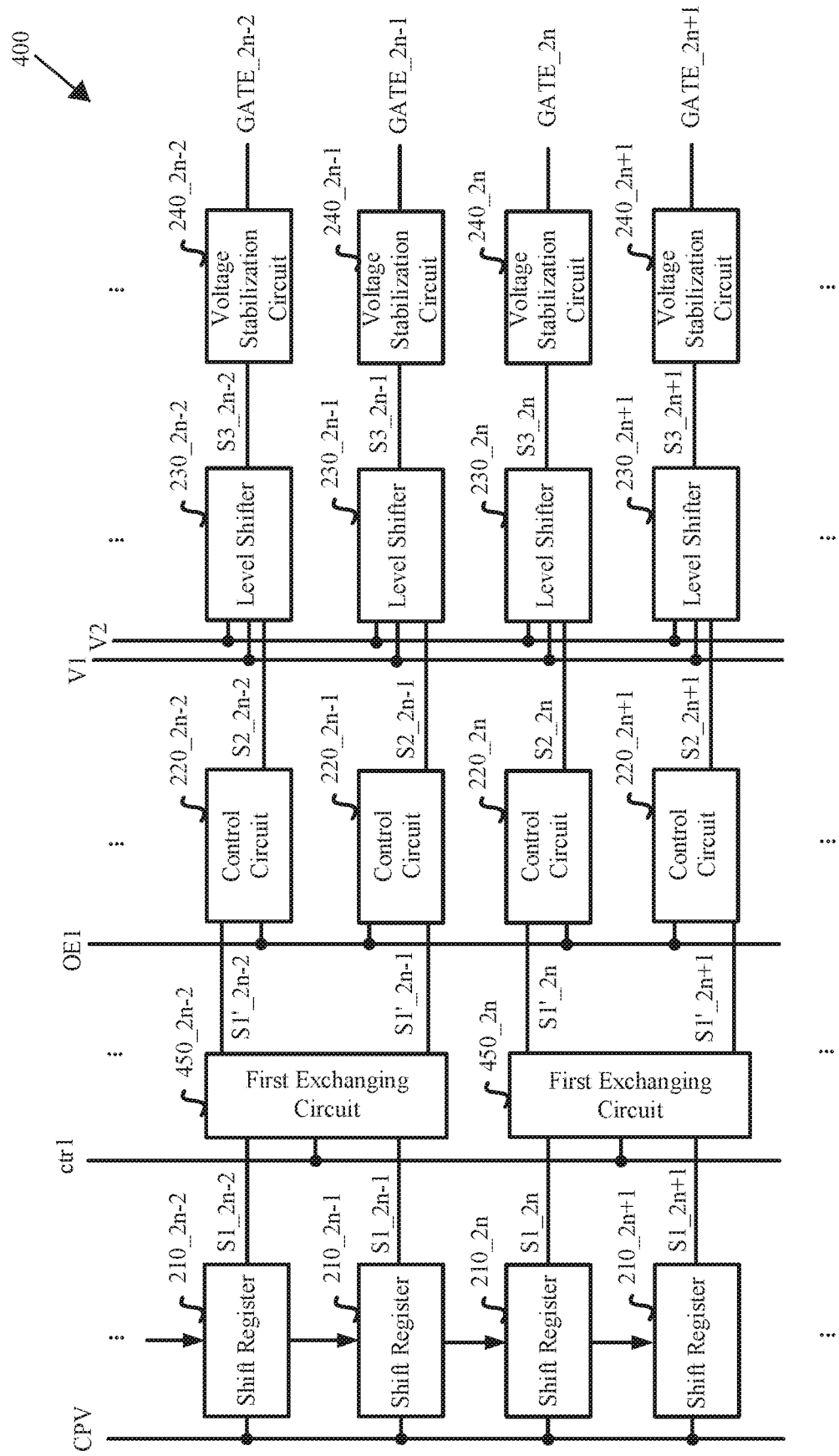
FIG. 4 is a schematic block diagram of the gate drive circuit according to an embodiment of the present disclosure.

FIG. 4 illustrates a schematic block diagram of a gate drive circuit 400 according to an embodiment of the present disclosure. As shown in FIG. 4, the gate drive circuit 400 includes a plurality of cascaded shift registers 210, a plurality of control circuits 220, a plurality of level shifters 230, a plurality of voltage stabilization circuits 240, and a plurality of first exchanging circuits ( . . . , 450_2n−2, 450_2n, . . . , hereinafter may be referred to as 450).

In the gate drive circuit 400 as shown in FIG. 4, the structure and connection relationship of the respective control circuits 220, the respective level shifters 230, and the respective voltage stabilization circuits 240 are the same as those of the respective control circuits 220, the respective level shifters 230, and the respective voltage stabilization circuits 240 in the gate drive circuit 200 as shown in FIG. 2. The description thereof is appropriately omitted here.

In the embodiment as shown in FIG. 4, the shift registers 210 at respective stages are coupled to the clock signal terminal CPV and the respective first exchanging circuits 450. Each shift register 210 outputs the respective first signal S1 under the control of the clock signal CPV. In this embodiment, the input terminal of the shift register 210_2n at the $2n^{th}$ stage is coupled to the output terminal of the shift register 210_2n−1 at the $(2n-1)^{th}$ stage. Therefore, the first signal outputted from the shift register 210_2n−1 at the $(2n-1)^{th}$ stage is used as the input signal of the shift register 210_2n at the $2n^{th}$ stage. The output terminal of the shift register 210_2n at the $2n^{th}$ stage is coupled to the input terminal of the shift register 210_2n+1 at the $(2n+1)^{th}$ stage. Therefore, the first signal outputted from the shift register 210_2n at the $2n^{th}$ stage is used as the input signal of the shift register 210_2n+1 at the $(2n+1)^{th}$ stage.

Each first exchanging circuit 450 is coupled to a first control signal terminal, the shift registers 210 at two respective stages and the control circuits 220 at two respective stages. In FIG. 4, the first exchanging circuit 450_2n is provided with the first signal S1_2n at the $2n^{th}$ stage and the first signal S1_2n+1 at the $(2n+1)^{th}$ stage. The first exchanging circuit 450_2n may be configured to enable exchanging the first signal S1_2n at the $2n^{th}$ stage and the first signal S1_2$n$+1 at the (2n+1)$^{th}$ stage. In some embodiments, the first exchanging circuit 450_2$n$ may exchange the first signal S1_2$n$ at the 2n$^{th}$ stage and the first signal S1_2$n$+1 at the (2n+1)$^{th}$ stage under the control of a first control signal from the first control signal terminal. By the first exchanging circuit 450_2$n$, the waveforms of the first signals S1_2$n$ and S1_2$n$+1 are exchanged. Then, the first exchanging circuit 450_2$n$ provides the exchanged first signals S1'_2$n$ and S1'_2$n$+1 to the control circuit 220_2$n$ at the 2n$^{th}$ stage and the control circuit 210_2$n$+1 at the (2n+1)$^{th}$ stage, respectively. In addition, in some other embodiments, the first exchanging circuit 450_2$n$ may not exchange the first signal S1_2$n$ at the 2n$^{th}$ stage and the first signal S1_2$n$+1 at the (2n+1)$^{th}$ stage under the control of the first control signal.

FIG. 4 illustrates only one embodiment of the present disclosure. Those skilled in the art should understand that, in another embodiment, the first exchanging circuit 450_2$n$ may be configured to enable exchanging the first signal S1_2$n$ at the 2n$^{th}$ stage and the first signal S1_2$n$−1 at the (2n−1)$^{th}$ stage. In some embodiments, the first exchanging circuit 450_2$n$ may exchange the first signal S1_2$n$ at the 2n$^{th}$ stage and the first signal S1_2$n$−1 at the (2n−1)$^{th}$ stage under the control of the first control signal from the first control signal terminal. By the first exchanging circuit 450_2$n$, the waveforms of the first signals S1_2$n$ and S1_2$n$−1 are exchanged. Then, the first exchanging circuit 450_2$n$ provides the exchanged first signals S1'_2$n$ and S1'_2$n$−1 to the control circuit 220_2$n$ at the 2n$^{th}$ stage and the control circuit 210_2$n$−1 at the (2n−1)$^{th}$ stage, respectively. In addition, in some other embodiments, the first exchanging circuit 450_2$n$ may not exchange the first signal S1_2$n$ at the 2n$^{th}$ stage and the first signal S1_2$n$−1 at the (2n−1)$^{th}$ stage under the control of the first control signal.

In addition, although it is shown in FIG. 4 that the first exchanging circuits 450 are located between the shift registers 210 and the control circuits 220 to exchange the first signals S1, those skilled in the art should understand that the first exchanging circuits 450 may also be located between the control circuits 220 and the level shifters 230 to exchange the second signals S2. And alternatively the first exchanging circuits 450 may also be located between the level shifters 230 and the voltage stabilization circuits 240 to exchange the third signals S3. And alternatively the first exchanging circuits 450 may also be located following the voltage stabilization circuit 240 to exchange the fourth signals GATE. By changing the locations of the first exchanging circuits 450 in the gate drive circuit 400, the first exchanging circuits 450 are able to perform any of the followings: exchanging the first signals at two adjacent stages, exchanging the second signals at two adjacent stages, exchanging the third signals at two adjacent stages, and exchanging the fourth signals at two adjacent stages.

Figure 5:
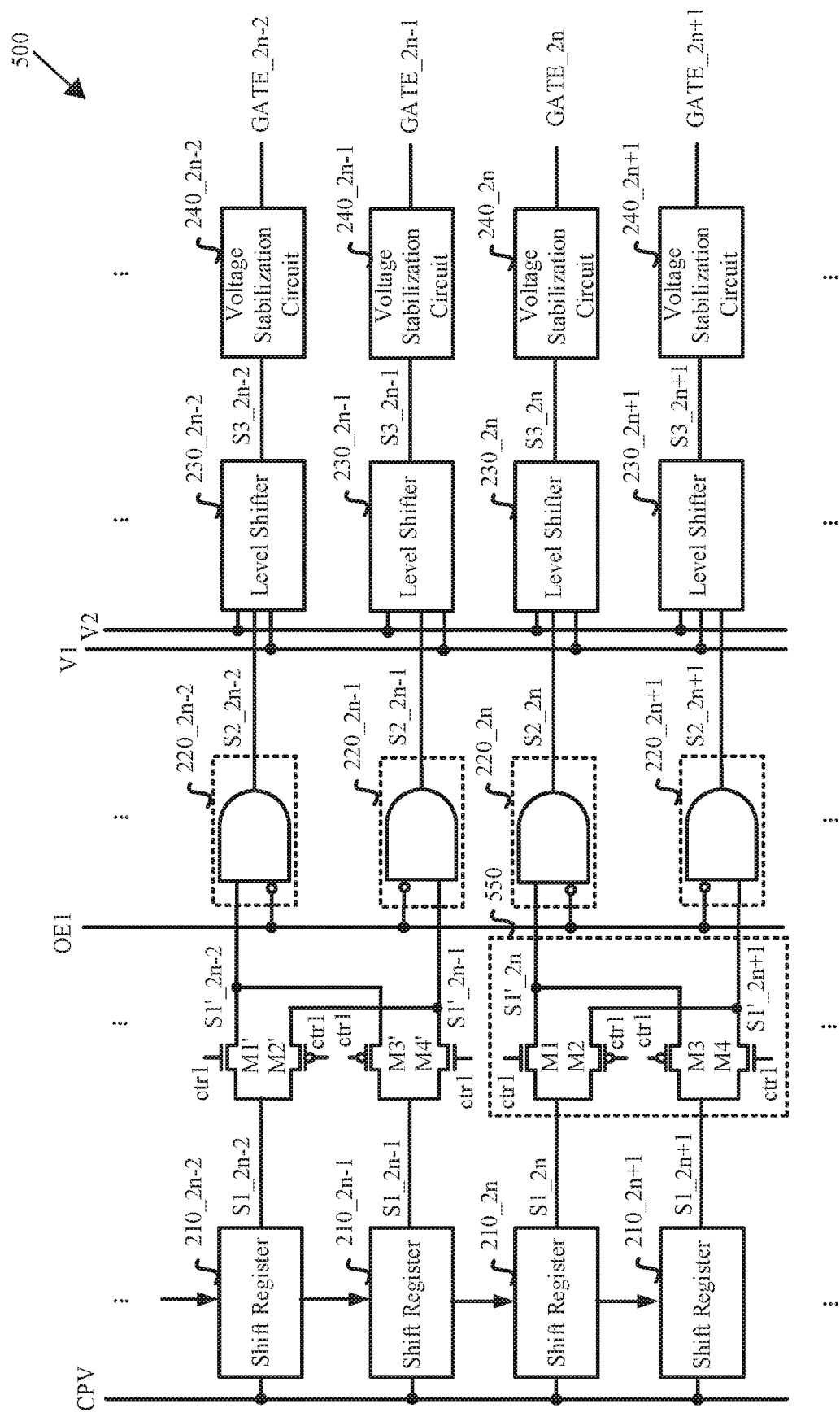
FIG. 5 is an exemplary circuit diagram of the gate drive circuit as shown in FIG. 4.

FIG. 5 shows an exemplary circuit diagram of the shift register 400 as shown in FIG. 4. In this example, the first exchanging circuit 550 is configured to enable exchanging the first signals S1 at the 2n$^{th}$ stage and the (2n+1)$^{th}$ stage. As shown in FIG. 5, the first exchanging circuit 550 includes a first transistor M1, a second transistor M2, a third transistor M3, and a fourth transistor M4. A control electrode of the first transistor M1 is coupled to a first control signal terminal ctrl. A first electrode of the first transistor M1 is coupled to an output terminal of the shift register 210_2$n$ at the 2n$^{th}$ stage. A second electrode of the first transistor M1 is coupled to an input terminal of the control circuit 220_2$n$ at the 2n$^{th}$ stage. A control electrode of the second transistor M2 is coupled to the first control signal terminal ctrl. A first electrode of the second transistor M2 is coupled to the output terminal of the shift register 210_2$n$ at the 2n$^{th}$ stage. A second electrode of the second transistor M2 is coupled to an input terminal of the control circuit 220_2$n$+1 at the (2n+1)$^{th}$ stage. A control electrode of the third transistor M3 is coupled to the first control signal terminal ctrl. A first electrode of the third transistor M3 is coupled to an output terminal of the shift register 210_2$n$+1 at the (2n+1)$^{th}$ stage. A second electrode of the third transistor M3 is coupled to the input terminal of the control circuit 220_2$n$ at the 2n$^{th}$ stage. A control electrode of the fourth transistor M4 is coupled to the first control signal terminal ctrl. A first electrode of the fourth transistor M4 is coupled to the output terminal of the shift register 210_2$n$+1 at the (2n+1)$^{th}$ stage. A second electrode of the fourth transistor M4 is coupled to the input terminal of the control circuit 220_2$n$+1 at the (2n+1)$^{th}$ stage.

In this embodiment, the first transistor M1 and the fourth transistor M4 are N-type transistors, and the second transistor M2 and the third transistor M3 are P-type transistors.

In some other embodiments of the present disclosure, the first transistor M1 and the fourth transistor M4 may be P-type transistors, and the second transistor M2 and the third transistor M3 may be N-type transistors.

In an alternative embodiment of the present disclosure, the second transistor M2 and the third transistor M3 may be controlled by a second control signal terminal. When the high voltage level is outputted from the first control signal terminal ctrl, the low voltage level is outputted from the second control signal terminal. When the low voltage level is outputted from the first control signal terminal ctrl, the high voltage level is outputted from the second control signal terminal. In this case, the first transistor M1, the second transistor M2, the third transistor M3, and the fourth transistor M4 may all be N-type transistors, or may all be P-type transistors.

In this alternative embodiment, the control electrode of the first transistor M1 is coupled to a first control signal terminal ctrl. The first electrode of the first transistor M1 is coupled to an output terminal of the shift register 210_2$n$ at the 2n$^{th}$ stage. The second electrode of the first transistor M1 is coupled to the input terminal of the control circuit 220_2$n$ at the 2n$^{th}$ stage. The control electrode of the second transistor M2 is coupled to a second control signal terminal (not shown). The first electrode of the second transistor M2 is coupled to the output terminal of the shift register 210_2$n$ at the 2n$^{th}$ stage. The second electrode of the second transistor M2 is coupled to the input terminal of the control circuit 220_2$n$+1 at the (2n+1)$^{th}$ stage. The control electrode of the third transistor M3 is coupled to the second control signal terminal (not shown). The first electrode of the third transistor M3 is coupled to the output terminal of the shift register 210_2$n$+1 at the (2n+1)$^{th}$ stage. The second electrode of the third transistor M3 is coupled to the input terminal of the control circuit 220_2$n$ at the 2n$^{th}$ stage. The control electrode of the fourth transistor M4 is coupled to the first control signal terminal ctrl. The first electrode of the fourth transistor M4 is coupled to the output terminal of the shift register 210_2$n$+1 at the (2n+1)$^{th}$ stage. The second electrode of the fourth transistor M4 is coupled to the input terminal of the control circuit 220_2$n$+1 at the (2n+1)$^{th}$ stage.

In some embodiments of the present disclosure, the control circuit 220 may include the AND gate. The input terminal of the AND gate is coupled to the control signal terminal OE1. The other input terminal of the AND gate is coupled to the output terminal of the respective shift register 210. The output terminal of the AND gate is coupled to the input terminal of the respective level shifter 230.

Figure 6:
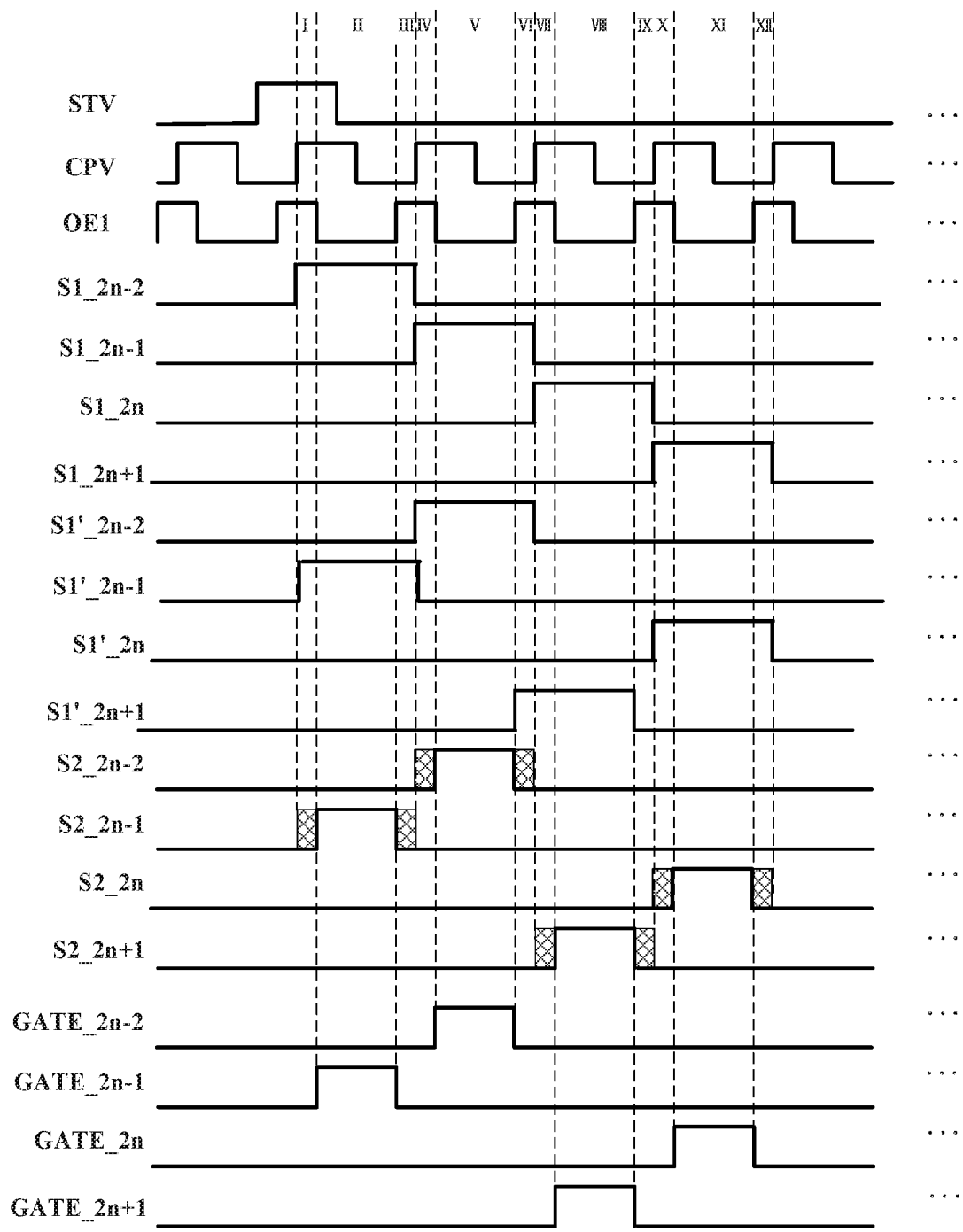
FIG. 6 is a timing diagram of some signals for the gate drive circuit as shown in FIG. 5.

FIG. 6 exemplarily shows an example of a timing diagram of some signals for the shift register 500 as shown in FIG. 5. In this example, it is assumed that the first control signal ctr1 is at the low voltage level. Therefore, the first transistor M1 and the fourth transistor M4 are disabled, and the second transistor M2 and the third transistor M3 are enabled. The first signal S1_2n at the $2n^{th}$ stage is provided to the control circuit 220_2n+1 at the $(2n+1)^{th}$ stage through the second transistor M2. The first signal S1_2n+1 at the $(2n+1)^{th}$ stage is provided to the control circuit 220_2n at the $2n^{th}$ stage through the third transistor M3. Therefore, it can be seen from FIG. 6 that after the first signals are exchanged by the first exchanging circuit 450, the waveform of signal S1'_2n is the same as the waveform of signal S1_2n+1, and the waveform of signal S1'_2n+1 is the same as the waveform of signal S1_2n. Similarly, the waveform of signal S1'_2n−2 is the same as the waveform of signal S1_2n−1, and the waveform of signal S1'_2n−1 is the same as the waveform of signal S1_2n−2.

When the control signal OE1 is at the low voltage level and the first signal S1 is at the high voltage level, the second signal S2 is at the high voltage level. Therefore, the second signal S2_2n−2 at the $(2n-2)^{th}$ stage is at the high voltage level only in the phase V. The second signal S2_2n−1 at the $(2n-1)^{th}$ stage is at the high voltage level only in the phase II. The second signal S2_2n at the $2n^{th}$ stage is at the high voltage level only in the phase XI. The second signal S2_2n+1 at the $(2n+1)^{th}$ stage is at the high voltage level only in the phase VIII.

Similar to the embodiment as shown in FIG. 3, the effective voltage level of the fourth signal GATE_2n−2 at the $(2n-2)^{th}$ stage aligns with the effective voltage level of the second signal S2_2n−2 at the $(2n-2)^{th}$ stage in the time domain. The effective voltage level of the fourth signal GATE_2n−1 at the $(2n-1)^{th}$ stage aligns with the effective voltage level of the second signal S2_2n−1 at the $(2n-1)^{th}$ stage in the time domain. The effective voltage level of the fourth signal GATE_2n at the $2n^{th}$ stage aligns with the effective voltage level of the second signal S2_2n at the $2n^{th}$ stage in the time domain. The effective voltage level of the fourth signal GATE_2n+1 at the $(2n+1)^{th}$ stage aligns with the effective voltage level of the second signal S2_2n+1 at the $(2n+1)^{th}$ stage in the time domain.

Therefore, compared with the example as shown in FIG. 3, in FIG. 6, the waveform of the fourth signal GATE_2n−2 at the $(2n-2)^{th}$ stage and the waveform of the fourth signal GATE_2n−1 at the $(2n-1)^{th}$ stage are exchanged. The waveform of the fourth signal GATE_2n at the $2n^{th}$ stage and the waveform of the fourth signal GATE_2n+1 at the $(2n+1)^{th}$ stage are exchanged.

According to the above embodiment, the gate drive circuit according to the embodiment of the present disclosure may exchange the output waveforms at two adjacent stages by the first exchanging circuit. Therefore, the gate drive circuit can change the lighting order of the sub-pixels without changing the architecture of the array substrate, thereby meeting the needs of different users.

In another example, it is assumed that the first control signal ctr1 is at the high voltage level. Therefore, the first transistor M1 and the fourth transistor M4 are enabled, and the second transistor M2 and the third transistor M3 are disabled. The first signal S1_2n at the $2n^{th}$ stage is provided to the control circuit 220_2n at the $2n^{th}$ stage through the first transistor M1. The first signal S1_2n+1 at the $(2n+1)^{th}$ stage is provided to the control circuit 220_2n+1 at the $(2n+1)^{th}$ stage through the fourth transistor M4. Therefore, the waveform of signal S1'_2n is the same as the waveform of signal S1_2n, and the waveform of signal S1'_2n+1 is the same as the waveform of signal S1_2n+1. In this case, the first exchanging circuit 550 does not exchange the waveform of the first signal S1. The gate drive circuit 500 may light up the sub-pixels row by row.

As described above, in some embodiments of the present disclosure, the first exchanging circuits 550 may be located between the control circuits 220 and the level shifters 230 to exchange the second signals S2. The first exchanging circuit 550 is configured to enable exchanging the second signals S2 at the $2n^{th}$ stage and the $(2n+1)^{th}$ stage.

In these embodiments, the first exchanging circuit 550 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the control circuit 220_2n at the $2n^{th}$ stage. The second electrode of the first transistor M1 is coupled to an input terminal of the level shifter 230_2n at the $2n^{th}$ stage. The control electrode of the second transistor M2 is coupled to the first control signal terminal ctr1. The first electrode of the second transistor M2 is coupled to the output terminal of the control circuit 220_2n at the $2n^{th}$ stage. The second electrode of the second transistor M2 is coupled to an input terminal of the level shifter 230_2n+1 at the $(2n+1)^{th}$ stage. The control electrode of the third transistor M3 is coupled to the first control signal terminal ctr1. The first electrode of the third transistor M3 is coupled to an output terminal of the control circuit 220_2n+1 at the $(2n+1)^{th}$ stage. The second electrode of the third transistor M3 is coupled to the input terminal of the level shifter 230_2n at the $2n^{th}$ stage. The control electrode of the fourth transistor M4 is coupled to the first control signal terminal ctr1. The first electrode of the fourth transistor M4 is coupled to the output terminal of the control circuit 220_2n+1 at the $(2n+1)^{th}$ stage. The second electrode of the fourth transistor M4 is coupled to the input terminal of the level shifter 230_2n+1 at the $(2n+1)^{th}$ stage.

In some embodiments of the present disclosure, the first exchanging circuits 550 may be located between the level shifters 230 and the voltage stabilization circuits 240 to exchange the third signals S3. The first exchanging circuit 550 is configured to enable exchanging the third signals S3 at the $2n^{th}$ stage and the $(2n+1)^{th}$ stage.

In these embodiments, the first exchanging circuit 550 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the level shifter 230_2n at the $2n^{th}$ stage. The second electrode of the first transistor M1 is coupled to an input terminal of the voltage stabilization circuit 240_2n at the $2n^{th}$ stage. The control electrode of the second transistor M2 is coupled to the first control signal terminal ctr1. The first electrode of the second transistor M2 is coupled to the output terminal of the level shifter 230_2n at the $2n^{th}$ stage. The second electrode of the second transistor M2 is coupled to an input terminal of the voltage stabilization circuit 240_2n+1 at the $(2n+1)^{th}$ stage. The control electrode of the third transistor M3 is coupled to the first control signal terminal ctr1. The first electrode of the third transistor M3 is coupled to an output terminal of the level shifter 230_2n+1 at the $(2n+1)^{th}$ stage. The second electrode of the third transistor M3 is coupled to the input terminal of the voltage stabilization circuit 240_2n at the $2n^{th}$ stage. The control electrode of the fourth transistor M4 is coupled to the first control signal terminal ctr1. The first electrode of the fourth transistor M4 is coupled to the output terminal of the level shifter 230_2n+1 at the $(2n+1)^{th}$ stage. The second electrode of the fourth transistor M4 is coupled to the input terminal of the voltage stabilization circuit 240_2n+1 at the $(2n+1)^{th}$ stage.

In some embodiments of the present disclosure, the first exchanging circuits 550 may be located following the voltage stabilization circuits 240 to exchange the fourth signals GATE. The first exchanging circuit 550 is configured to enable exchanging the fourth signals GATE at the $2n^{th}$ stage and the $(2n+1)^{th}$ stage.

In these embodiments, the first exchanging circuit 550 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the voltage stabilization circuit 240_2n at the $2n^{th}$ stage. The second electrode of the first transistor M1 is coupled to a $2n^{th}$ output terminal of the gate drive circuit. The control electrode of the second transistor M2 is coupled to the first control signal terminal ctr1. The first electrode of the second transistor M2 is coupled to the output terminal of the voltage stabilization circuit 240_2n at the $2n^{th}$ stage. The second electrode of the second transistor M2 is coupled to a $(2n+1)^{th}$ output terminal of the gate drive circuit. The control electrode of the third transistor M3 is coupled to the first control signal terminal ctr1. The first electrode of the third transistor M3 is coupled to an output terminal of the voltage stabilization circuit 240_2n+1 at the $(2n+1)^{th}$ stage. The second electrode of the third transistor M3 is coupled to the $2n^{th}$ output terminal of the gate drive circuit. The control electrode of the fourth transistor M4 is coupled to the first control signal terminal ctr1. The first electrode of the fourth transistor M4 is coupled to the output terminal of the voltage stabilization circuit 240_2n+1 at the $(2n+1)^{th}$ stage. The second electrode of the fourth transistor M4 is coupled to the $(2n+1)^{th}$ output terminal of the gate drive circuit.

Figure 7:
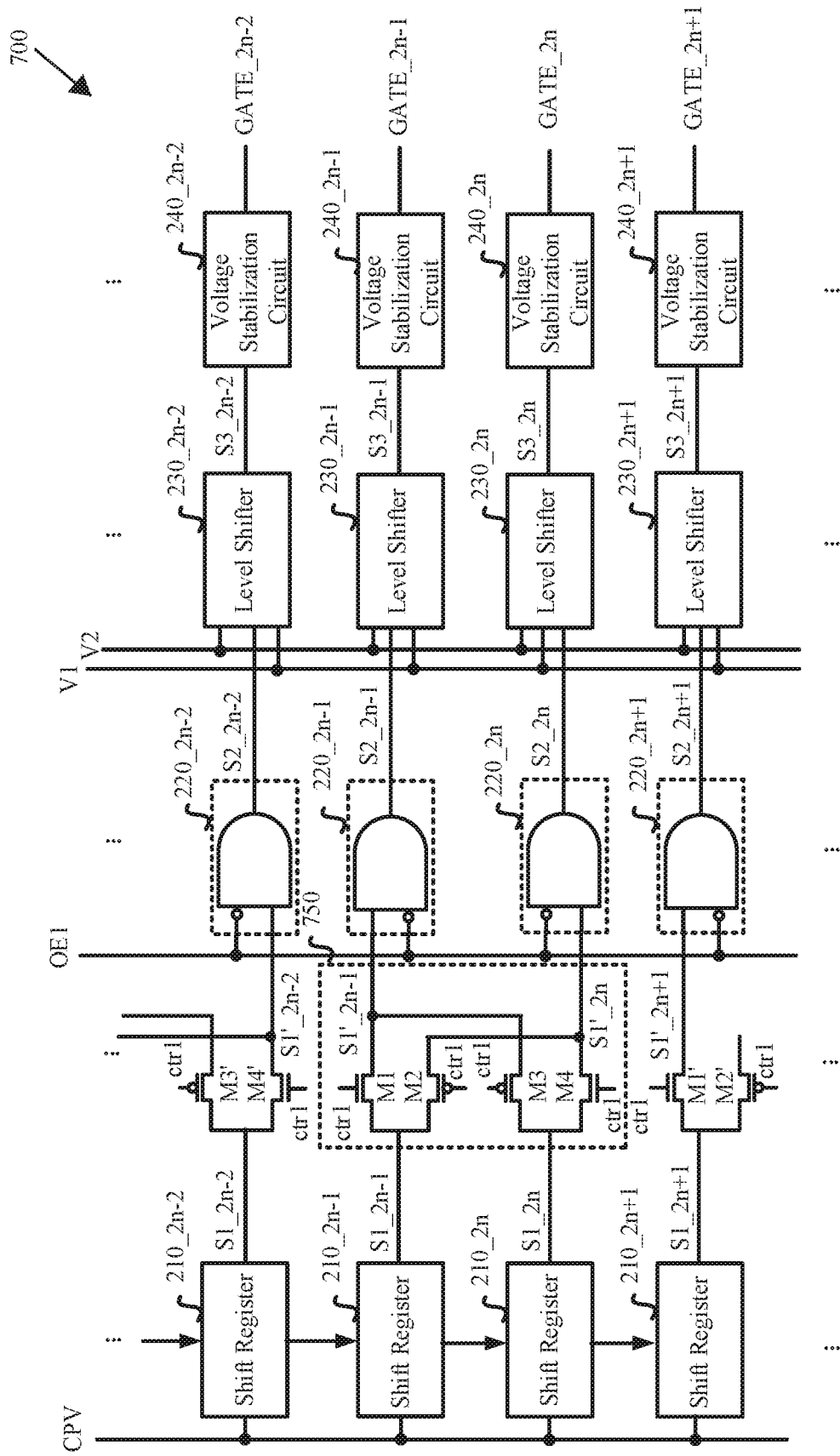
FIG. 7 is an exemplary circuit diagram of the gate drive circuit as shown in FIG. 4.

FIG. 7 is another exemplary circuit diagram of the gate drive circuit 400 shown in FIG. 4. In this example, the first exchanging circuit 750 is configured to enable exchanging the first signals S1 at the $2n^{th}$ stage and the $(2n-1)^{th}$ stage. As shown in FIG. 7, the first exchanging circuit 750 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the shift register 210_2n−1 at the $(2n-1)^{th}$ stage. The second electrode of the first transistor M1 is coupled to an input terminal of the control circuit 220_2n−1 at the $(2n-1)^{th}$ stage. The control electrode of the second transistor M2 is coupled to the first control signal terminal ctr1. The first electrode of the second transistor M2 is coupled to the output terminal of the shift register 210_2n−1 at the $(2n-1)^{th}$ stage. The second electrode of the second transistor M2 is coupled to an input terminal of the control circuit 220_2n at the $2n^{th}$ stage. The control electrode of the third transistor M3 is coupled to the first control signal terminal ctr1. The first electrode of the third transistor M3 is coupled to an output terminal of the shift register 210_2n at the $2n^{th}$ stage. The second electrode of the third transistor M3 is coupled to the input terminal of the control circuit 220_2n−1 at the $(2n-1)^{th}$ stage. The control electrode of the fourth transistor M4 is coupled to the first control signal terminal ctr1. The first electrode of the fourth transistor M4 is coupled to the output terminal of the shift register 210_2n at the $2n^{th}$ stage. The second electrode of the fourth transistor M4 is coupled to the input terminal of the control circuit 220_2n at the $2n^{th}$ stage.

In this embodiment, the first transistor M1 and the fourth transistor M4 are N-type transistors, and the second transistor M2 and the third transistor M3 are P-type transistors.

In some other embodiments of the present disclosure, the first transistor M1 and the fourth transistor M4 may be P-type transistors, and the second transistor M2 and the third transistor M3 may be N-type transistors.

Figure 8:
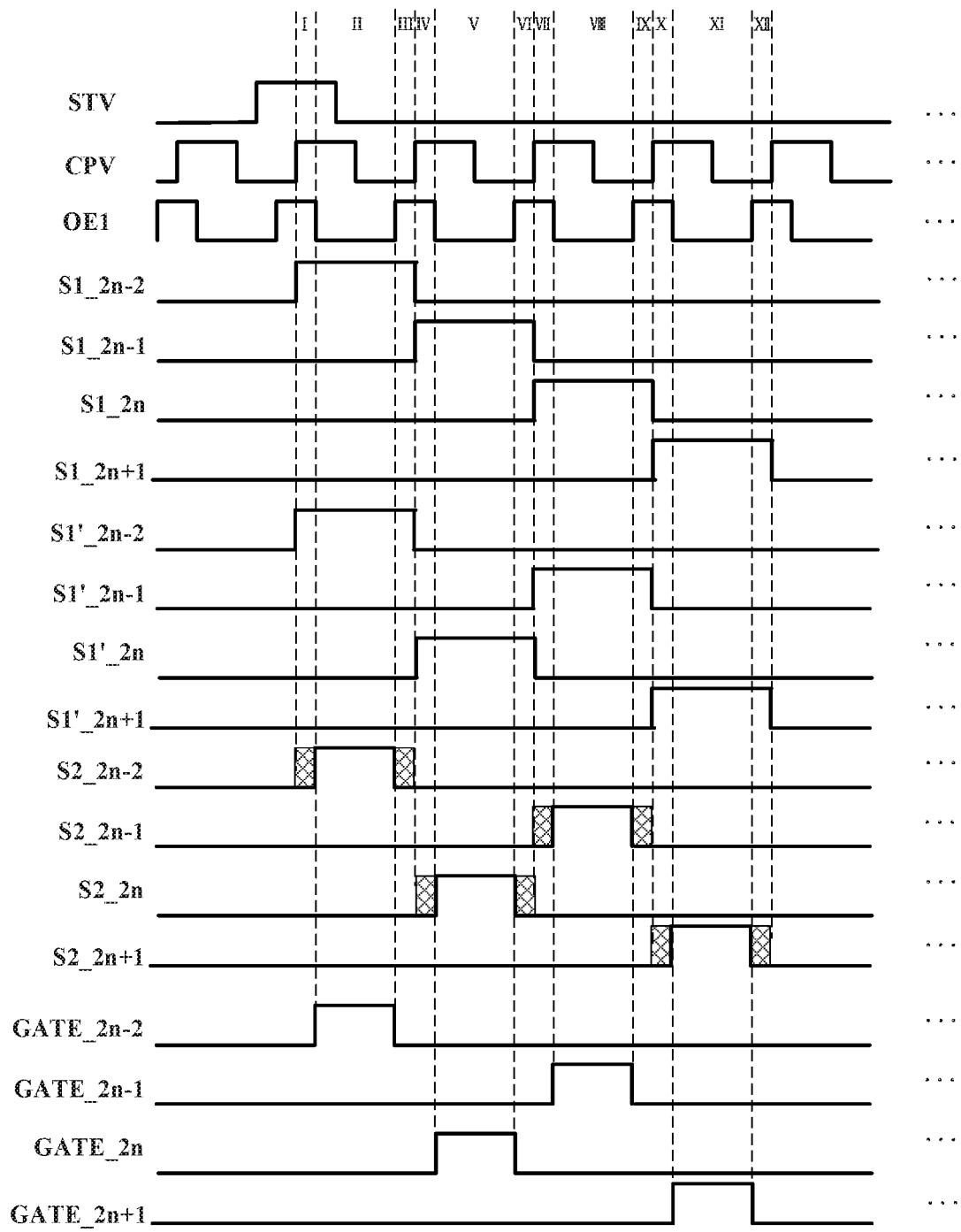
FIG. 8 is a timing diagram of some signals for the gate drive circuit as shown in FIG. 7.

FIG. 8 exemplarily shows another example of the timing diagram of some signals for the shift register 700 as shown in FIG. 7. In this example, it is assumed that the first control signal ctr1 is at the low voltage level. Therefore, the first transistor M1 and the fourth transistor M4 are disabled, and the second transistor M2 and the third transistor M3 are enabled. The first signal S1_2n−1 at the $(2n-1)^{th}$ stage is provided to the control circuit 220_2n at the $2n^{th}$ stage through the second transistor M2. The first signal S1_2n at the $2n^{th}$ stage is provided to the control circuit 220_2n−1 at the $(2n-1)^{th}$ stage through the third transistor M3. Therefore, it can be seen from FIG. 8 that the waveform of signal S1'_2n is the same as the waveform of signal S1_2n−1, and the waveform of signal S1'_2n−1 is the same as the waveform of signal S1_2n.

When the control signal OE1 is at the low voltage level and the first signal S1 is at the high voltage level, the second signal S2 is at the high voltage level. Therefore, the second signal S2_2n−2 at the $(2n-2)^{th}$ stage is at the high voltage level only in the phase II. The second signal S2_2n−1 at the $(2n-1)^{th}$ stage is at the high voltage level only in the phase VIII. The second signal S2_2n at the $2n^{th}$ stage is at the high voltage level only in the phase V. The second signal S2_2n+1 at the $(2n+1)^{th}$ stage is at the high voltage level only in the phase XI.

Similar to the embodiment as shown in FIG. 3, the effective voltage level of the fourth signal GATE_2n−2 at the $(2n-2)^{th}$ stage aligns with the effective voltage level of the second signal S2_2n−2 at the $(2n-2)^{th}$ stage in the time domain. The effective voltage level of the fourth signal GATE_2n−1 at the $(2n-1)^{th}$ stage aligns with the effective voltage level of the second signal S2_2n−1 at the $(2n-1)^{th}$ stage in the time domain. The effective voltage level of the fourth signal GATE_2n at the $2n^{th}$ stage aligns with the effective voltage level of the second signal S2_2n at the $2n^{th}$ stage in the time domain. The effective voltage level of the fourth signal GATE_2n+1 at the $(2n+1)^{th}$ stage aligns with the effective voltage level of the second signal S2_2n+1 at the $(2n+1)^{th}$ stage in the time domain.

Therefore, compared with the example as shown in FIG. 3, in FIG. 8, the waveform of the fourth signal GATE_2n at the $2n^{th}$ stage and the waveform of the fourth signal GATE_2n−1 at the $(2n-1)^{th}$ stage are exchanged.

According to the above embodiment, the gate drive circuit may exchange the output waveforms at two adjacent stages by the first exchanging circuit. Therefore, the gate drive circuit can change the lighting order of the sub-pixels without changing the architecture of the array substrate, thereby meeting the needs of different users.

In another example, it is assumed that the first control signal ctr1 is at the high voltage level. Therefore, the first transistor M1 and the fourth transistor M4 are enabled, and the second transistor M2 and the third transistor M3 are disabled. The first signal S1_2n−1 at the $(2n-1)^{th}$ stage is provided to the control circuit 220_2n−1 at the $(2n-1)^{th}$ stage through the first transistor M1. The first signal S1_2n at the $2n^{th}$ stage is provided to the control circuit 220_2n at the $2n^{th}$ stage through the fourth transistor M4. Therefore, the waveform of signal S1'_2n–1 is the same as the waveform of signal S1_2n–1, and the waveform of signal S1'_2n is the same as the waveform of signal S1_2n. In this case, the first exchanging circuit 750 does not exchange the waveform of the first signal S1. The gate drive circuit 700 may light up the sub-pixels row by row.

As described above, in some embodiments of the present disclosure, the first exchanging circuits 750 may be located between the control circuits 220 and the level shifters 230 to exchange the second signals S2. The first exchanging circuit 750 is configured to enable exchanging the second signals S2 at the $2n^{th}$ stage and the $(2n-1)^{th}$ stage.

In these embodiments, the first exchanging circuit 750 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the control circuit 220_2n–1 at the $(2n-1)^{th}$ stage. The second electrode of the first transistor M1 is coupled to an input terminal of the level shifter 230_2n–1 at the $(2n-1)^{th}$ stage. The control electrode of the second transistor M2 is coupled to the first control signal terminal ctr1. The first electrode of the second transistor M2 is coupled to the output terminal of the control circuit 220_2n–1 at the $(2n-1)^{th}$ stage. The second electrode of the second transistor M2 is coupled to an input terminal of the level shifter 230_2n at the $2n^{th}$ stage. The control electrode of the third transistor M3 is coupled to the first control signal terminal ctr1. The first electrode of the third transistor M3 is coupled to the output terminal of the control circuit 220_2n at the $2n^{th}$ stage. The second electrode of the third transistor M3 is coupled to the input terminal of the level shifter 230_2n–1 at the $(2n-1)^{th}$ stage. The control electrode of the fourth transistor M4 is coupled to the first control signal terminal ctr1. The first electrode of the fourth transistor M4 is coupled to the output terminal of the control circuit 220_2n at the $2n^{th}$ stage. The second electrode of the fourth transistor M4 is coupled to the input terminal of the level shifter 230_2n at the $2n^{th}$ stage.

In some embodiments of the present disclosure, the first exchanging circuits 750 may be located between the level shifters 230 and the voltage stabilization circuits 240 to exchange the third signals S3. The first exchanging circuit 750 is configured to enable exchanging the third signals S3 at the $2n^{th}$ stage and the $(2n-1)^{th}$ stage.

In these embodiments, the first exchanging circuit 750 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the level shifter 230_2n–1 at the $(2n-1)^{th}$ stage. The second electrode of the first transistor M1 is coupled to an input terminal of the voltage stabilization circuit 240_2n–1 at the $(2n-1)^{th}$ stage. The control electrode of the second transistor M2 is coupled to the first control signal terminal ctr1. The first electrode of the second transistor M2 is coupled to the output terminal of the level shifter 230_2n–1 at the $(2n-1)^{th}$ stage. The second electrode of the second transistor M2 is coupled to the input terminal of the voltage stabilization circuit 240_2n at the $2n^{th}$ stage. The control electrode of the third transistor M3 is coupled to the first control signal terminal ctr1. The first electrode of the third transistor M3 is coupled to the output terminal of the level shifter 230_2n at the $2n^{th}$ stage. The second electrode of the third transistor M3 is coupled to the input terminal of the voltage stabilization circuit 240_2n–1 at the $(2n-1)^{th}$ stage. The control electrode of the fourth transistor M4 is coupled to the first control signal terminal ctr1. The first electrode of the fourth transistor M4 is coupled to the output terminal of the level shifter 230_2n at the $2n^{th}$ stage. The second electrode of the fourth transistor M4 is coupled to the input terminal of the voltage stabilization circuit 240_2n at the $2n^{th}$ stage.

In some embodiments of the present disclosure, the first exchanging circuits 750 may be located following the voltage stabilization circuits 240 to exchange the fourth signals GATE. The first exchanging circuit 750 is configured to enable exchanging the fourth signals GATE at the $2n^{th}$ stage and the $(2n-1)^{th}$ stage.

In these embodiments, the first exchanging circuit 750 includes the first transistor M1, the second transistor M2, the third transistor M3, and the fourth transistor M4. The control electrode of the first transistor M1 is coupled to the first control signal terminal ctr1. The first electrode of the first transistor M1 is coupled to an output terminal of the voltage stabilization circuit 240_2n–1 at the $(2n-1)^{th}$ stage. The second electrode of the first transistor M1 is coupled to a $(2n-1)^{th}$ output terminal of the gate drive circuit. The control electrode of the second transistor M2 is coupled to the first control signal terminal ctr1. The first electrode of the second transistor M2 is coupled to the output terminal of the voltage stabilization circuit 240_2n–1 at the $(2n-1)^{th}$ stage. The second electrode of the second transistor M2 is coupled to a $2n^{th}$ output terminal of the gate drive circuit. The control electrode of the third transistor M3 is coupled to the first control signal terminal ctr1. The first electrode of the third transistor M3 is coupled to the output terminal of the voltage stabilization circuit 240_2n at the $2n^{th}$ stage. The second electrode of the third transistor M3 is coupled to the $(2n-1)^{th}$ output terminal of the gate drive circuit. The control electrode of the fourth transistor M4 is coupled to the first control signal terminal ctr1. The first electrode of the fourth transistor M4 is coupled to the output terminal of the voltage stabilization circuit 240_2n at the $2n^{th}$ stage. The second electrode of the fourth transistor M4 is coupled to the $2n^{th}$ output terminal of the gate drive circuit.

Figure 9:
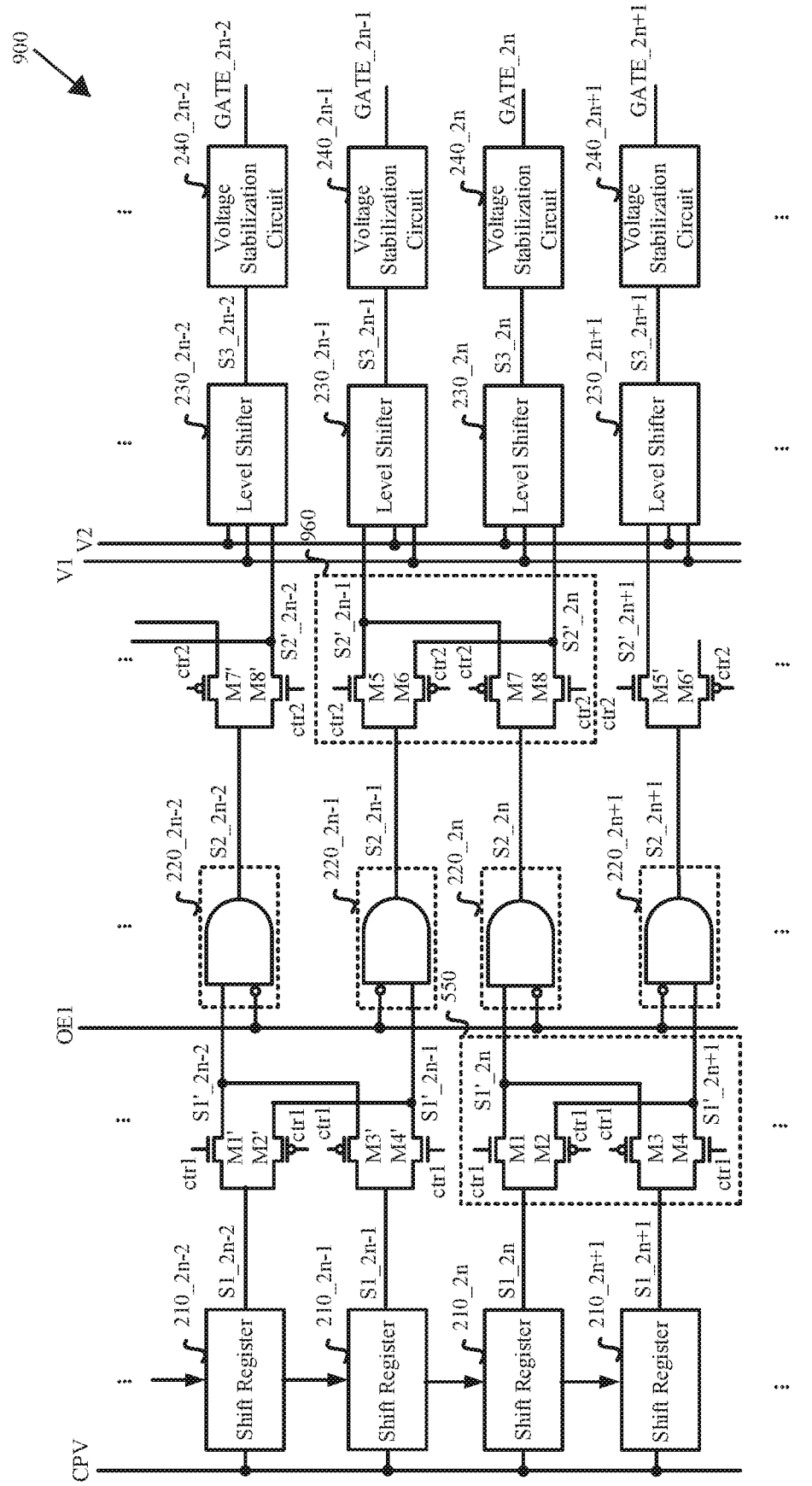
FIG. 9 is an exemplary circuit diagram of the gate drive circuit according to an embodiment of the present disclosure.

FIG. 9 illustrates an exemplary circuit diagram of the gate drive circuit 900 according to an embodiment of the present disclosure. As shown in FIG. 9, in addition to the gate drive circuit 500 as shown in FIG. 5, the gate drive circuit 900 further includes a plurality of second exchanging circuits 960. In this embodiment, the first exchanging circuit 550 is configured to enable exchanging the first signals S1 at the $2n^{th}$ stage and the $(2n+1)^{th}$ stage, and the second exchanging circuit 960 is configured to enable exchanging the second signals S2 at the $2n^{th}$ stage and the $(2n-1)^{th}$ stage.

As shown in FIG. 9, the second exchanging circuit 960 includes a fifth transistor M5, a sixth transistor M6, a seventh transistor M7, and an eighth transistor M8. A control electrode of the fifth transistor M5 is coupled to a second control signal terminal ctr2. A first electrode of the fifth transistor M5 is coupled to an output terminal of the control circuit 220_2n–1 at the $(2n-1)^{th}$ stage. A second electrode of the fifth transistor M5 is coupled to an input terminal of the level shifter 230_2n–1 at the $(2n-1)^{th}$ stage. A control electrode of the sixth transistor M6 is coupled to the second control signal terminal ctr2. A first electrode of the sixth transistor M6 is coupled to the output terminal of the control circuit 220_2n–1 at the $(2n-1)^{th}$ stage. A second electrode of the sixth transistor M6 is coupled to an input terminal of the level shifter 230_2n at the $2n^{th}$ stage. A control electrode of the seventh transistor M7 is coupled to the second control signal terminal ctr2. A first electrode of the seventh transistor M7 is coupled to an output terminal of the control circuit 220_2n at the $2n^{th}$ stage. A second electrode of the seventh transistor M7 is coupled to the input terminal of the level shifter 230_2n-1 at the $(2n-1)^{th}$ stage. A control electrode of the eighth transistor M8 is coupled to the second control signal terminal ctr2. A first electrode of the eighth transistor M8 is coupled to the output terminal of the control circuit 220_2n at the $2n^{th}$ stage. A second electrode of the eighth transistor M8 is coupled to the input terminal of the level shifter 230_2n at the $2n^{th}$ stage.

In this embodiment, the fifth transistor M5 and the eighth transistor M8 are N-type transistors, and the sixth transistor M6 and the seventh transistor M7 are P-type transistors.

Similar to the working principle of the first exchanging circuit 550, when the second control signal ctr2 is at the low voltage level, the second exchanging circuit 960 may exchange the second signals S2 at the $2n^{th}$ stage and the $(2n-1)^{th}$ stage. When the second control signal ctr2 is at the high voltage level, the second exchanging circuit 960 may not exchange the second signals S2 at the $2n^{th}$ stage and the $(2n-1)^{th}$ stage. In this way, the gate drive circuit according to the embodiment of the present disclosure may exchange the output waveforms at the $2n^{th}$ stage and the $(2n+1)^{th}$ stage by the first exchanging circuit, and may also exchange the output waveforms at the $2n^{th}$ stage and the $(2n-1)^{th}$ stage by the second exchanging circuit. Therefore, the gate drive circuit can change the lighting order of the sub-pixels by the first exchanging circuit or the second exchanging circuit without changing the architecture of the array substrate, thereby meeting the needs of different users.

In some other embodiments of the present disclosure, the fifth transistor M5 and the eighth transistor M8 are P-type transistors, and the sixth transistor M6 and the seventh transistor M7 are N-type transistors.

In some embodiments of the present disclosure, in a case where the first exchanging circuit 550 is also configured to enable exchanging the second signals S2 at the $2n^{th}$ stage and the $(2n+1)^{th}$ stage, in the second exchanging circuit 960, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the control circuit 220_2n-1 at the $(2n-1)^{th}$ stage. The second electrode of the fifth transistor M5 is coupled to the input terminal of the level shifter 230_2n-1 at the $(2n-1)^{th}$ stage. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the input terminal of the level shifter 230_2n at the $2n^{th}$ stage. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the control circuit 220_2n at the $2n^{th}$ stage. The second electrode of the seventh transistor M7 is coupled to the input terminal of the level shifter 230_2n-1 at the $(2n-1)^{th}$ stage. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the input terminal of the level shifter 230_2n at the $2n^{th}$ stage.

In some embodiments of the present disclosure, the second exchanging circuits 960 may be located between the shift registers 210 and the control circuits 220 to exchange the first signals S1. The second exchanging circuit 960 is configured to enable exchanging the first signals S1 at the $2n^{th}$ stage and the $(2n-1)^{th}$ stage. The second exchanging circuit includes the fifth transistor M5, the sixth transistor M6, the seventh transistor M7, and the eighth transistor M8.

In a case where the first exchanging circuit 550 is configured to enable exchanging the first signals S1 at the $2n^{th}$ stage and the $(2n+1)^{th}$ stage, in the second exchanging circuit 960, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the shift register 210_2n-1 at the $(2n-1)^{th}$ stage. The second electrode of the fifth transistor M5 is coupled to the input terminal of the control circuit 220_2n-1 at the $(2n-1)^{th}$ stage. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the input terminal of the control circuit 220_2n at the $2n^{th}$ stage. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the shift register 210_2n at the $2n^{th}$ stage. The second electrode of the seventh transistor M7 is coupled to the input terminal of the control circuit 220_2n-1 at the $(2n-1)^{th}$ stage. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the input terminal of the control circuit 220_2n at the $2n^{th}$ stage.

In a case where the first exchanging circuit 550 is configured to enable any of the followings: exchanging the second signals S2 at the $2n^{th}$ stage and the $(2n+1)^{th}$ stage, exchanging the third signals S3 at the $2n^{th}$ stage and the $(2n+1)^{th}$ stage, and exchanging the fourth signal GATE at the $2n^{th}$ stage and the $(2n+1)^{th}$ stage, in the second exchanging circuit 960, the control electrode of the fifth transistor M5 is coupled to the second control signal terminal ctr2. The first electrode of the fifth transistor M5 is coupled to the output terminal of the shift register 210_2n-1 at the $(2n-1)^{th}$ stage. The second electrode of the fifth transistor M5 is coupled to the input terminal of the control circuit 220_2n-1 at the $(2n-1)^{th}$ stage. The control electrode of the sixth transistor M6 is coupled to the second control signal terminal ctr2. The first electrode of the sixth transistor M6 is coupled to the output terminal of the shift register 210_2n-1 at the $(2n-1)^{th}$ stage. The second electrode of the sixth transistor M6 is coupled to the input terminal of the control circuit 220_2n at the $2n^{th}$ stage. The control electrode of the seventh transistor M7 is coupled to the second control signal terminal ctr2. The first electrode of the seventh transistor M7 is coupled to the output terminal of the shift register 210_2n at the $2n^{th}$ stage. The second electrode of the seventh transistor M7 is coupled to the input terminal of the control circuit 220_2n-1 at the $(2n-1)^{th}$ stage. The control electrode of the eighth transistor M8 is coupled to the second control signal terminal ctr2. The first electrode of the eighth transistor M8 is coupled to the output terminal of the shift register 210_2n at the $2n^{th}$ stage.

The second electrode of the eighth transistor M8 is coupled to the input terminal of the control circuit 220_2n at the 2n$^{th}$ stage.

In some embodiments of the present disclosure, the second exchanging circuits 960 may be located between the level shifters 230 and the voltage stabilization circuits 240 to exchange the third signals S3. The second exchanging circuit 960 is configured to enable exchanging the third signals S3 at the 2n$^{th}$ stage and the (2n−1)$^{th}$ stage. The second exchanging circuit 960 includes the fifth transistor M5, the sixth transistor M6, the seventh transistor M7, and the eighth transistor M8.

In a case where the first exchanging circuit 550 is configured to enable exchanging the third signals S3 at the 2n$^{th}$ stage and the (2n+1)$^{th}$ stage, in the second exchanging circuit 960, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the shifter 230_2n−1 at the (2n−1)$^{th}$ stage. The second electrode of the fifth transistor M5 is coupled to the input terminal of the voltage stabilization circuit 240_2n−1 at the (2n−1)$^{th}$ stage. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the input terminal of the voltage stabilization circuit 240_2n at the 2n$^{th}$ stage. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the level shifter 230_2n at the 2n$^{th}$ stage. The second electrode of the seventh transistor M7 is coupled to the input terminal of the voltage stabilization circuit 240_2n−1 at the (2n−1)$^{th}$ stage. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the input terminal of the voltage stabilization circuit 240_2n at the 2n$^{th}$ stage.

In a case where the first exchanging circuit 550 is configured to enable any of the followings: exchanging the first signals S1 at the 2n$^{th}$ stage and the (2n+1)$^{th}$ stage, exchanging the second signals S2 at the 2n$^{th}$ stage and the (2n+1)$^{th}$ stage, and exchanging the fourth signal GATE at the 2n$^{th}$ stage and the (2n+1)$^{th}$ stage, in the second exchanging circuit 960, the control electrode of the fifth transistor M5 is coupled to the second control signal terminal ctr2. The first electrode of the fifth transistor M5 is coupled to the output terminal of the level shifter 230_2n−1 at the (2n−1)$^{th}$ stage. The second electrode of the fifth transistor M5 is coupled to the input terminal of the voltage stabilization circuit 240_2n−1 at the (2n−1)$^{th}$ stage. The control electrode of the sixth transistor M6 is coupled to the second control signal terminal ctr2. The first electrode of the sixth transistor M6 is coupled to the output terminal of the level shifter 230_2n−1 at the (2n−1)$^{th}$ stage. The second electrode of the sixth transistor M6 is coupled to the input terminal of the voltage stabilization circuit 240_2n at the 2n$^{th}$ stage. The control electrode of the seventh transistor M7 is coupled to the second control signal terminal ctr2. The first electrode of the seventh transistor M7 is coupled to the output terminal of the level shifter 230_2n at the 2n$^{th}$ stage. The second electrode of the seventh transistor M7 is coupled to the input terminal of the voltage stabilization circuit 240_2n−1 at the (2n−1)$^{th}$ stage. The control electrode of the eighth transistor M8 is coupled to the second control signal terminal ctr2. The first electrode of the eighth transistor M8 is coupled to the output terminal of the level shifter 230_2n at the 2n$^{th}$ stage. The second electrode of the eighth transistor M8 is coupled to the input terminal of the voltage stabilization circuit 240_2n at the 2n$^{th}$ stage.

In some embodiments of the present disclosure, the second exchanging circuits 960 may be located following the voltage stabilization circuits 240 to exchange the fourth signals GATE. The second exchanging circuit 960 is configured to enable exchanging the fourth signal GATE at the 2n$^{th}$ stage and the (2n−1)$^{th}$ stage. The second exchanging circuit includes the fifth transistor M5, the sixth transistor M6, the seventh transistor M7, and the eighth transistor M8.

In a case where the first exchanging circuit 550 is configured to enable exchanging the fourth signals GATE at the 2n$^{th}$ stage and the (2n+1)$^{th}$ stage, in the second exchanging circuit 960, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the voltage stabilization circuit 240_2n−1 at the (2n−1)$^{th}$ stage. The second electrode of the fifth transistor M5 is coupled to the (2n−1)$^{th}$ output terminal of the gate drive circuit. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the 2n$^{th}$ output terminal of the gate drive circuit. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the voltage stabilization circuit 240_2n at the 2n$^{th}$ stage. The second electrode of the seventh transistor M7 is coupled to the (2n−1)$^{th}$ output terminal of the gate drive circuit. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the 2n$^{th}$ output terminal of the gate drive circuit.

In a case where the first exchanging circuit 550 is configured to enable any of the followings: exchanging the first signals S1 at the 2n$^{th}$ stage and the (2n+1)$^{th}$ stage, exchanging the second signals S2 at the 2n$^{th}$ stage and the (2n+1)$^{th}$ stage, and exchanging the third signals S3 at the 2n$^{th}$ stage and the (2n+1)$^{th}$ stage, in the second exchanging circuit 960, the control electrode of the fifth transistor M5 is coupled to the second control signal terminal ctr2. The first electrode of the fifth transistor M5 is coupled to the output terminal of the voltage stabilization circuit 240_2n−1 at the (2n−1)$^{th}$ stage. The second electrode of the fifth transistor M5 is coupled to the (2n−1)$^{th}$ output terminal of the gate drive circuit. The control electrode of the sixth transistor M6 is coupled to the second control signal terminal ctr2. The first electrode of the sixth transistor M6 is coupled to the output terminal of the voltage stabilization circuit 240_2n−1 at the (2n−1)$^{th}$ stage. The second electrode of the sixth transistor M6 is coupled to the 2n$^{th}$ output terminal of the gate drive circuit. The control electrode of the seventh transistor M7 is coupled to the second control signal terminal ctr2. The first electrode of the seventh transistor M7 is coupled to the output terminal of the voltage stabilization circuit 240_2n at the $2n^{th}$ stage. The second electrode of the seventh transistor M7 is coupled to the $(2n-1)^{th}$ output terminal of the gate drive circuit. The control electrode of the eighth transistor M8 is coupled to the second control signal terminal ctr2. The first electrode of the eighth transistor M8 is coupled to the output terminal of the voltage stabilization circuit 240_2n at the $2n^{th}$ stage. The second electrode of the eighth transistor M8 is coupled to the $2n^{th}$ output terminal of the gate drive circuit.

In some other embodiments of the present disclosure, in addition to the gate drive circuit 700 as shown in FIG. 7, the gate drive circuit may further include a plurality of second exchanging circuits. In these embodiments, the first exchanging circuit 750 is configured to enable exchanging the first signals S1 at the $2n^{th}$ stage and the $(2n-1)^{th}$ stage, and the second exchanging circuit is configured to enable exchanging the second signals S2 at the $2n^{th}$ stage and the $(2n+1)^{th}$ stage. The second exchanging circuit 960 includes the fifth transistor M5, the sixth transistor M6, the seventh transistor M7, and the eighth transistor M8. The control electrode of the fifth transistor M5 is coupled to the second control signal terminal ctr2. The first electrode of the fifth transistor M5 is coupled to the output terminal of the control circuit 220_2n at the $2n^{th}$ stage. The second electrode of the fifth transistor M5 is coupled to the input terminal of the level shifter 230_2n at the $2n^{th}$ stage. The control electrode of the sixth transistor M6 is coupled to the second control signal terminal ctr2. The first electrode of the sixth transistor M6 is coupled to the output terminal of the control circuit 220_2n at the $2n^{th}$ stage. The second electrode of the sixth transistor M6 is coupled to the input terminal of the level shifter 230_2n+1 at the $(2n+1)^{th}$ stage. The control electrode of the seventh transistor M7 is coupled to the second control signal terminal ctr2. The first electrode of the seventh transistor M7 is coupled to the output terminal of the control circuit 220_2n+1 at the $(2n+1)^{th}$ stage. The second electrode of the seventh transistor M7 is coupled to the input terminal of the level shifter 230_2n at the $2n^{th}$ stage. The control electrode of the eighth transistor M8 is coupled to the second control signal terminal ctr2. The first electrode of the eighth transistor M8 is coupled to the output terminal of the control circuit 220_2n+1 at the $(2n+1)^{th}$ stage. The second electrode of the eighth transistor M8 is coupled to the input terminal of the level shifter 230_2n+1 at the $(2n+1)^{th}$ stage.

In a case where the first exchanging circuit 750 is also configured to enable exchanging the second signals S2 at the $2n^{th}$ stage and the $(2n-1)^{th}$ stage, in the second exchanging circuit 960, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the control circuit 220_2n at the $2n^{th}$ stage. The second electrode of the fifth transistor M5 is coupled to the input terminal of the level shifter 230_2n at the $2n^{th}$ stage. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the input terminal of the level shifter 230_2n+1 at the $(2n+1)^{th}$ stage. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the control circuit 220_2n+1 at the $(2n+1)^{th}$ stage. The second electrode of the seventh transistor M7 is coupled to the input terminal of the level shifter 230_2n at the $2n^{th}$ stage. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the input terminal of the level shifter 230_2n+1 at the $(2n+1)^{th}$ stage.

In some embodiments of the present disclosure, the second exchanging circuits may be located between the shift registers 210 and the control circuits 220 to exchange the first signals S1. The second exchanging circuit is configured to enable exchanging the first signals S1 at the $2n^{th}$ stage and the $(2n+1)^{th}$ stage. The second exchanging circuit includes the fifth transistor M5, the sixth transistor M6, the seventh transistor M7, and the eighth transistor M8.

In a case where the first exchanging circuit 750 is configured to enable exchanging the first signals S1 at the $2n^{th}$ stage and the $(2n-1)^{th}$ stage, in the second exchanging circuit, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the shift register 210_2n at the $2n^{th}$ stage. The second electrode of the fifth transistor M5 is coupled to the input terminal of the control circuit 220_2n at the $2n^{th}$ stage. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the input terminal of the control circuit 220_2n+1 at the $(2n+1)^{th}$ stage. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the shift register 210_2n+1 at the $(2n+1)^{th}$ stage. The second electrode of the seventh transistor M7 is coupled to the input terminal of the control circuit 220_2n at the $2n^{th}$ stage. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the input terminal of the control circuit 220_2n+1 at the $(2n+1)^{th}$ stage.

In a case where the first exchanging circuit 750 is configured to enable any of the followings: exchanging the second signals S2 at the $2n^{th}$ stage and the $(2n-1)^{th}$ stage, exchanging the third signals S3 at the $2n^{th}$ stage and the $(2n-1)^{th}$ stage, and exchanging the fourth signal GATE at the $2n^{th}$ stage and the $(2n-1)^{th}$ stage, in the second exchanging circuit, the control electrode of the fifth transistor M5 is coupled to the second control signal terminal ctr2. The first electrode of the fifth transistor M5 is coupled to the output terminal of the shift register 210_2n at the $2n^{th}$ stage. The second electrode of the fifth transistor M5 is coupled to the input terminal of the control circuit 220_2n at the $2n^{th}$ stage. The control electrode of the sixth transistor M6 is coupled to the second control signal terminal ctr2. The first electrode of the sixth transistor M6 is coupled to the output terminal of the shift register 210_2n at the $2n^{th}$ stage. The second electrode of the sixth transistor M6 is coupled to the input terminal of the control circuit 220_2n+1 at the $(2n+1)^{th}$ stage. The control electrode of the seventh transistor M7 is coupled to the second control signal terminal ctr2. The first electrode of the seventh transistor M7 is coupled to the output terminal of the shift register 210_2n+1 at the (2n+1)$^{th}$ stage. The second electrode of the seventh transistor M7 is coupled to the input terminal of the control circuit 220_2n at the 2n$^{th}$ stage. The control electrode of the eighth transistor M8 is coupled to the second control signal terminal ctr2. The first electrode of the eighth transistor M8 is coupled to the output terminal of the shift register 210_2n+1 at the (2n+1)$^{th}$ stage. The second electrode of the eighth transistor M8 is coupled to the input terminal of the control circuit 220_2n+1 at the (2n+1)$^{th}$ stage.

In some embodiments of the present disclosure, the second exchanging circuits may be located between the level shifters 230 and the voltage stabilization circuits 240 to exchange the third signals S3. The second exchanging circuit is configured to enable exchanging the third signals S3 at the 2n$^{th}$ stage and the (2n+1)$^{th}$ stage. The second exchanging circuit includes the fifth transistor M5, the sixth transistor M6, the seventh transistor M7, and the eighth transistor M8.

In a case where the first exchanging circuit 750 is configured to enable exchanging the third signals S3 at the 2n$^{th}$ stage and the (2n−1)$^{th}$ stage, in the second exchanging circuit, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the shifter 230_2n at the 2n$^{th}$ stage. The second electrode of the fifth transistor M5 is coupled to the input terminal of the voltage stabilization circuit 240_2n at the 2n$^{th}$ stage. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the input terminal of the voltage stabilization circuit 240_2n+1 at the (2n+1)$^{th}$ stage. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the level shifter 230_2n+1 at the (2n+1)$^{th}$ stage. The second electrode of the seventh transistor M7 is coupled to the input terminal of the voltage stabilization circuit 240_2n at the 2n$^{th}$ stage. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the input terminal of the voltage stabilization circuit 240_2n+1 at the (2n+1)$^{th}$ stage.

In a case where the first exchanging circuit 750 is configured to enable any of the followings: exchanging the first signals S1 at the 2n$^{th}$ stage and the (2n−1)$^{th}$ stage, exchanging the second signals S2 at the 2n$^{th}$ stage and the (2n−1)$^{th}$ stage, and exchanging the fourth signal GATE at the 2n$^{th}$ stage and the (2n−1)$^{th}$ stage, in the second exchanging circuit, the control electrode of the fifth transistor M5 is coupled to the second control signal terminal ctr2. The first electrode of the fifth transistor M5 is coupled to the output terminal of the level shifter 230_2n at the 2n$^{th}$ stage. The second electrode of the fifth transistor M5 is coupled to the input terminal of the voltage stabilization circuit 240_2n at the 2n$^{th}$ stage. The control electrode of the sixth transistor M6 is coupled to the second control signal terminal ctr2. The first electrode of the sixth transistor M6 is coupled to the output terminal of the level shifter 230_2n at the 2n$^{th}$ stage. The second electrode of the sixth transistor M6 is coupled to the input terminal of the voltage stabilization circuit 240_2n+1 at the (2n+1)$^{th}$ stage. The control electrode of the seventh transistor M7 is coupled to the second control signal terminal ctr2. The first electrode of the seventh transistor M7 is coupled to the output terminal of the level shifter 230_2n+1 at the (2n+1)$^{th}$ stage. The second electrode of the seventh transistor M7 is coupled to the input terminal of the voltage stabilization circuit 240_2n at the 2n$^{th}$ stage. The control electrode of the eighth transistor M8 is coupled to the second control signal terminal ctr2. The first electrode of the eighth transistor M8 is coupled to the output terminal of the level shifter 230_2n+1 at the (2n+1)$^{th}$ stage. The second electrode of the eighth transistor M8 is coupled to the input terminal of the voltage stabilization circuit 240_2n+1 at the (2n+1)$^{th}$ stage.

In some embodiments of the present disclosure, the second exchanging circuits may be located following the voltage stabilization circuits 240 to exchange the fourth signals GATE. The second exchanging circuit is configured to enable exchanging the fourth signal GATE at the 2n$^{th}$ stage and the (2n+1)$^{th}$ stage. The second exchanging circuit includes the fifth transistor M5, the sixth transistor M6, the seventh transistor M7, and the eighth transistor M8.

In a case where the first exchanging circuit 750 is configured to enable exchanging the fourth signals GATE at the 2n$^{th}$ stage and the (2n−1)$^{th}$ stage, in the second exchanging circuit, the control electrode of the fifth transistor M5 is coupled to the second control signal terminal ctr2. The first electrode of the fifth transistor M5 is coupled to the second electrode of the fourth transistor M4. The first electrode of the fourth transistor M4 is coupled to the output terminal of the voltage stabilization circuit 240_2n at the 2n$^{th}$ stage. The second electrode of the fifth transistor M5 is coupled to the 2n$^{th}$ output terminal of the gate drive circuit. The control electrode of the sixth transistor M6 is coupled to the second control signal terminal ctr2. The first electrode of the sixth transistor M6 is coupled to the second electrode of the fourth transistor M4. The second electrode of the sixth transistor M6 is coupled to the (2n+1)$^{th}$ output terminal of the gate drive circuit. The control electrode of the seventh transistor M7 is coupled to the second control signal terminal ctr2. The first electrode of the seventh transistor M7 is coupled to the second electrode of the first transistor M1. The first electrode of the first transistor M1 is coupled to the output terminal of the voltage stabilization circuit 240_2n+1 at the (2n+1)$^{th}$ stage. The second electrode of the seventh transistor M7 is coupled to the 2n$^{th}$ output terminal of the gate drive circuit. The control electrode of the eighth transistor M8 is coupled to the second control signal terminal ctr2. The first electrode of the eighth transistor M8 is coupled to the second electrode of the first transistor M1. The second electrode of the eighth transistor M8 is coupled to the (2n+1)$^{th}$ output terminal of the gate drive circuit.

In a case where the first exchanging circuit 750 is configured to enable any of the followings: exchanging the first signals S1 at the 2n$^{th}$ stage and the (2n−1)$^{th}$ stage, exchanging the second signals S2 at the 2n$^{th}$ stage and the (2n−1)$^{th}$ stage, and exchanging the third signals S3 at the 2n$^{th}$ stage and the (2n−1)$^{th}$ stage, in the second exchanging circuit, the control electrode of the fifth transistor M5 is coupled to the second control signal terminal ctr2. The first electrode of the fifth transistor M5 is coupled to the output terminal of the voltage stabilization circuit 240_2n at the 2n$^{th}$ stage. The second electrode of the fifth transistor M5 is coupled to the 2n$^{th}$ output terminal of the gate drive circuit. The control electrode of the sixth transistor M6 is coupled to the second control signal terminal ctr2. The first electrode of the sixth transistor M6 is coupled to the output terminal of the voltage stabilization circuit 240_2n at the $2n^{th}$ stage. The second electrode of the sixth transistor M6 is coupled to the $(2n+1)^{th}$ output terminal of the gate drive circuit. The control electrode of the seventh transistor M7 is coupled to the second control signal terminal ctr2. The first electrode of the seventh transistor M7 is coupled to the output terminal of the voltage stabilization circuit 240_2n+1 at the $(2n+1)^{th}$ stage. The second electrode of the seventh transistor M7 is coupled to the $2n^{th}$ output terminal of the gate drive circuit. The control electrode of the eighth transistor M8 is coupled to the second control signal terminal ctr2. The first electrode of the eighth transistor M8 is coupled to the output terminal of the voltage stabilization circuit 240_2n+1 at the $(2n+1)^{th}$ stage. The second electrode of the eighth transistor M8 is coupled to the $(2n+1)^{th}$ output terminal of the gate drive circuit.

Figure 10:
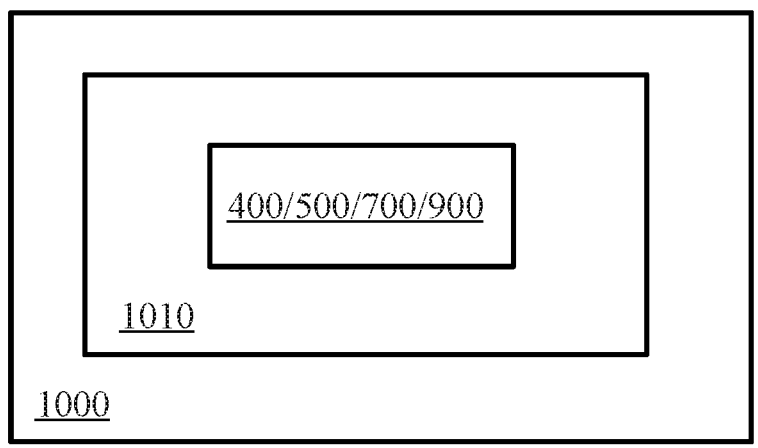
FIG. 10 is a schematic block diagram of a display device according to an embodiment of the present disclosure.

FIG. 10 illustrates a schematic block diagram of a display device 1000 according to an embodiment of the present disclosure. The display device 1000 includes an array substrate 1010. The array substrate 1010 includes the aforementioned gate drive circuits (400, 500, 700, and 900).

The display device 1000 provided in the embodiments of the present disclosure can be applied to any product with a display function, for example, among others, electronic paper, mobile phone, tablet computer, television, notebook computer, digital photo frame, wearable device, or navigator.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A gate drive circuit comprising:
a plurality of cascaded shift registers, wherein the shift registers at respective stages output respective first signals;
a plurality of control circuits, wherein each control circuit is coupled to a respective shift register, and is configured to process the respective first signal to generate a respective second signal, and wherein the effective voltage levels of the second signals are spaced apart in a time domain;
a plurality of level shifters, wherein each level shifter is coupled to a respective control circuit, and is configured to convert the voltage level of the respective second signal to generate a respective third signal;
a plurality of voltage stabilization circuits, wherein each voltage stabilization circuit is coupled to a respective level shifter, and is configured to stabilize the respective third signal, and wherein the stabilized third signal is outputted as a fourth signal; and
a plurality of first exchanging circuits, wherein the first exchanging circuit is configured to enable any of the following: exchanging the first signals at a $2n^{th}$ stage and a $(2n+1)^{th}$ stage, exchanging the second signals at the $2n^{th}$ stage and the $(2n+1)^{th}$ stage, exchanging the third signals at the $2n^{th}$ stage and the $(2n+1)^{th}$ stage, and exchanging the fourth signals at the $2n^{th}$ stage and the $(2n+1)^{th}$ stage, wherein n is a natural number;
wherein the first exchanging circuit comprises a first transistor, a second transistor, a third transistor, and a fourth transistor,
wherein a control electrode of the first transistor is coupled to a first control signal terminal, wherein a first electrode of the first transistor is coupled to an output terminal of the shift register at the $2n^{th}$ stage, and wherein a second electrode of the first transistor is coupled to an input terminal of the control circuit at the $2n^{th}$ stage; wherein a control electrode of the second transistor is coupled to the first control signal terminal, wherein a first electrode of the second transistor is coupled to the output terminal of the shift register at the $2n^{th}$ stage, and wherein a second electrode of the second transistor is coupled to an input terminal of the control circuit at the $(2n+1)^{th}$ stage; wherein a control electrode of the third transistor is coupled to the first control signal terminal, wherein a first electrode of the third transistor is coupled to an output terminal of the shift register at the $(2n+1)^{th}$ stage, and wherein a second electrode of the third transistor is coupled to the input terminal of the control circuit at the $2n^{th}$ stage; and wherein a control electrode of the fourth transistor is coupled to the first control signal terminal, wherein a first electrode of the fourth transistor is coupled to the output terminal of the shift register at the $(2n+1)^{th}$ stage, and wherein a second electrode of the fourth transistor is coupled to the input terminal of the control circuit at the $(2n+1)^{th}$ stage; or
wherein a control electrode of the first transistor is coupled to a first control signal terminal, wherein a first electrode of the first transistor is coupled to an output terminal of the control circuit at the $2n^{th}$ stage, and wherein a second electrode of the first transistor is coupled to an input terminal of the level shifter at the $2n^{th}$ stage; wherein a control electrode of the second transistor is coupled to the first control signal terminal, wherein a first electrode of the second transistor is coupled to the output terminal of the control circuit at the $2n^{th}$ stage, and wherein a second electrode of the second transistor is coupled to an input terminal of the level shifter at the $(2n+1)^{th}$ stage; wherein a control electrode of the third transistor is coupled to the first control signal terminal, wherein a first electrode of the third transistor is coupled to an output terminal of the control circuit at the $(2n+1)^{th}$ stage, and wherein a second electrode of the third transistor is coupled to the input terminal of the level shifter at the $2n^{th}$ stage; and wherein a control electrode of the fourth transistor is coupled to the first control signal terminal, wherein a first electrode of the fourth transistor is coupled to the output terminal of the control circuit at the $(2n+1)^{th}$ stage, and wherein a second electrode of the fourth transistor is coupled to the input terminal of the level shifter at the $(2n+1)^{th}$ stage; or wherein a control electrode of the first transistor is coupled to a first control signal terminal, wherein a first electrode of the first transistor is coupled to an output terminal of the level shifter at the $2n^{th}$ stage, and wherein a second electrode of the first transistor is coupled to an input terminal of the voltage stabilization circuit at the $2n^{th}$ stage; wherein a control electrode of the second transistor is coupled to the first control signal terminal, wherein a first electrode of the second transistor is coupled to the output terminal of the level shifter at the $2n^{th}$ stage, and wherein a second electrode of the second transistor is coupled to an input terminal of the voltage stabilization circuit at the $(2n+1)^{th}$ stage; wherein a control electrode of the third transistor is coupled to the first control signal terminal, wherein a first electrode of the third transistor is coupled to an output terminal of the level shifter at the $(2n+1)^{th}$ stage, and wherein a second electrode of the third transistor is coupled to the input terminal of the voltage stabilization circuit at the $2n^{th}$ stage; and wherein a control electrode of the fourth transistor is coupled to the first control signal terminal, wherein a first electrode of the fourth transistor is coupled to the output terminal of the level shifter at the $(2n+1)^{th}$ stage, and wherein a second electrode of the fourth transistor is coupled to the input terminal of the voltage stabilization circuit at the $(2n+1)^{th}$ stage; or wherein a control electrode of the first transistor is coupled to a first control signal terminal, wherein a first electrode of the first transistor is coupled to an output terminal of the voltage stabilization circuit at the $2n^{th}$ stage, and wherein a second electrode of the first transistor is coupled to a $2n^{th}$ output terminal of the gate drive circuit wherein a control electrode of the second transistor is coupled to the first control signal terminal, wherein a first electrode of the second transistor is coupled to the output terminal of the voltage stabilization circuit at the $2n^{th}$ stage, and wherein a second electrode of the second transistor is coupled to a $(2n+1)^{th}$ output terminal of the gate drive circuit wherein a control electrode of the third transistor is coupled to the first control signal terminal, wherein a first electrode of the third transistor is coupled to an output terminal of the voltage stabilization circuit at the $(2n+1)^{th}$ stage, and wherein a second electrode of the third transistor is coupled to the $2n^{th}$ output terminal of the gate drive circuit and wherein a control electrode of the fourth transistor is coupled to the first control signal terminal, wherein a first electrode of the fourth transistor is coupled to the output terminal of the voltage stabilization circuit at the $(2n+1)^{th}$ stage, and wherein a second electrode of the fourth transistor is coupled to the $(2n+1)^{th}$ output terminal of the gate drive circuit.

2. The gate drive circuit according to claim 1, wherein the gate drive circuit further comprises a plurality of second exchanging circuits, wherein the second exchanging circuit is configured to enable any of the following: exchanging the first signals at a $2n^{th}$ stage and a $(2n-1)^{th}$ stage, exchanging the second signals at the $2n^{th}$ stage and the $(2n-1)^{th}$ stage, exchanging the third signals at the $2n^{th}$ stage and the $(2n-1)^{th}$ stage, and exchanging the fourth signals at the $2n^{th}$ stage and the $(2n-1)^{th}$ stage.

3. The gate drive circuit according to claim 2, wherein the second exchanging circuit comprises a fifth transistor, a sixth transistor, a seventh transistor, and an eighth transistor, wherein a control electrode of the fifth transistor is coupled to a second control signal terminal, wherein a first electrode of the fifth transistor is coupled to an output terminal of the control circuit at the $(2n-1)^{th}$ stage, and wherein a second electrode of the fifth transistor is coupled to an input terminal of the level shifter at the $(2n-1)^{th}$ stage;

wherein a control electrode of the sixth transistor is coupled to the second control signal terminal, wherein a first electrode of the sixth transistor is coupled to the output terminal of the control circuit at the $(2n-1)^{th}$ stage, and wherein a second electrode of the sixth transistor is coupled to an input terminal of the level shifter at the $2n^{th}$ stage;

wherein a control electrode of the seventh transistor is coupled to the second control signal terminal, wherein a first electrode of the seventh transistor is coupled to an output terminal of the control circuit at the $2n^{th}$ stage, and wherein a second electrode of the seventh transistor is coupled to the input terminal of the level shifter at the $(2n-1)^{th}$ stage; and wherein a control electrode of the eighth transistor is coupled to the second control signal terminal, wherein a first electrode of the eighth transistor is coupled to the output terminal of the control circuit at the $2n^{th}$ stage, and wherein a second electrode of the eighth transistor is coupled to the input terminal of the level shifter at the $2n^{th}$ stage.

4. The gate drive circuit according to claim 3, wherein the fifth transistor and the eighth transistor are N-type transistors, and wherein the sixth transistor and the seventh transistor are P-type transistors; or wherein the fifth transistor and the eighth transistor are P-type transistors, and wherein the sixth transistor and the seventh transistor are N-type transistors.

5. The gate drive circuit according to claim 2, wherein the second exchanging circuit comprises a fifth transistor, a sixth transistor, a seventh transistor, and an eighth transistor, wherein a control electrode of the fifth transistor is coupled to a second control signal terminal, wherein a first electrode of the fifth transistor is coupled to an output terminal of the shift register at the $(2n-1)^{th}$ stage, and wherein a second electrode of the fifth transistor is coupled to an input terminal of the control circuit at the $(2n-1)^{th}$ stage;

wherein a control electrode of the sixth transistor is coupled to the second control signal terminal, wherein a first electrode of the sixth transistor is coupled to the output terminal of the shift register at the $(2n-1)^{th}$ stage, and wherein a second electrode of the sixth transistor is coupled to an input terminal of the control circuit at the $2n^{th}$ stage;

wherein a control electrode of the seventh transistor is coupled to the second control signal terminal, wherein a first electrode of the seventh transistor is coupled to an output terminal of the shift register at the $2n^{th}$ stage, and wherein a second electrode of the seventh transistor is coupled to the input terminal of the control circuit at the $(2n-1)^{th}$ stage; and wherein a control electrode of the eighth transistor is coupled to the second control signal terminal, wherein a first electrode of the eighth transistor is coupled to the output terminal of the shift register at the $2n^{th}$ stage, and wherein a second electrode of the eighth transistor is coupled to the input terminal of the control circuit at the $2n^{th}$ stage.

6. The gate drive circuit according to claim 2, wherein the second exchanging circuit comprises a fifth transistor, a sixth transistor, a seventh transistor, and an eighth transistor,
wherein a control electrode of the fifth transistor is coupled to a second control signal terminal, wherein a first electrode of the fifth transistor is coupled to an output terminal of the level shifter at the $(2n-1)^{th}$ stage, and wherein a second electrode of the fifth transistor is coupled to an input terminal of the voltage stabilization circuit at the $(2n-1)^{th}$ stage;
wherein a control electrode of the sixth transistor is coupled to the second control signal terminal, wherein a first electrode of the sixth transistor is coupled to the output terminal of the level shifter at the $(2n-1)^{th}$ stage, and wherein a second electrode of the sixth transistor is coupled to an input terminal of the voltage stabilization circuit at the $2n^{th}$ stage;
wherein a control electrode of the seventh transistor is coupled to the second control signal terminal, wherein a first electrode of the seventh transistor is coupled to an output terminal of the level shifter at the $2n^{th}$ stage, and wherein a second electrode of the seventh transistor is coupled to the input terminal of the voltage stabilization circuit at the $(2n-1)^{th}$ stage; and
wherein a control electrode of the eighth transistor is coupled to the second control signal terminal, wherein a first electrode of the eighth transistor is coupled to the output terminal of the level shifter at the $2n^{th}$ stage, and wherein a second electrode of the eighth transistor is coupled to the input terminal of the voltage stabilization circuit at the $2n^{th}$ stage.

7. The gate drive circuit according to claim 2, wherein the second exchanging circuit comprises a fifth transistor, a sixth transistor, a seventh transistor, and an eighth transistor,
wherein a control electrode of the fifth transistor is coupled to a second control signal terminal, wherein a first electrode of the fifth transistor is coupled to an output terminal of the voltage stabilization circuit at the $(2n-1)^{th}$ stage, and wherein a second electrode of the fifth transistor is coupled to a $(2n-1)^{th}$ output terminal of the gate drive circuit;
wherein a control electrode of the sixth transistor is coupled to the second control signal terminal, wherein a first electrode of the sixth transistor is coupled to the output terminal of the voltage stabilization circuit at the $(2n-1)^{th}$ stage, and wherein a second electrode of the sixth transistor is coupled to a $2n^{th}$ output terminal of the gate drive circuit;
wherein a control electrode of the seventh transistor is coupled to the second control signal terminal, wherein a first electrode of the seventh transistor is coupled to an output terminal of the voltage stabilization circuit at the $2n^{th}$ stage, and wherein a second electrode of the seventh transistor is coupled to the $(2n-1)^{th}$ output terminal of the gate drive circuit; and
wherein a control electrode of the eighth transistor is coupled to the second control signal terminal, wherein a first electrode of the eighth transistor is coupled to the output terminal of the voltage stabilization circuit at the $2n^{th}$ stage, and wherein a second electrode of the eighth transistor is coupled to the $2n^{th}$ output terminal of the gate drive circuit.

8. The gate drive circuit according to claim 1, wherein the first transistor and the fourth transistor are N-type transistors, and wherein the second transistor and the third transistor are P-type transistors; or
wherein the first transistor and the fourth transistor are P-type transistors, and wherein the second transistor and the third transistor are N-type transistors.

9. An array substrate comprising the gate drive circuit according to claim 1.

10. A display device comprising the array substrate according to claim 9.

11. A gate drive circuit comprising:
a plurality of cascaded shift registers, wherein the shift registers at respective stages output respective first signals;
a plurality of control circuits, wherein each control circuit is coupled to a respective shift register, and is configured to process the respective first signal to generate a respective second signal, and wherein the effective voltage levels of the second signals are spaced apart in a time domain;
a plurality of level shifters, wherein each level shifter is coupled to a respective control circuit, and is configured to convert the voltage level of the respective second signal to generate a respective third signal;
a plurality of voltage stabilization circuits, wherein each voltage stabilization circuit is coupled to a respective level shifter, and is configured to stabilize the respective third signal, and wherein the stabilized third signal is outputted as a fourth signal; and
a plurality of first exchanging circuits, wherein the first exchanging circuit is configured to enable any of the following: exchanging the first signals at a $2n^{th}$ stage and a $(2n-1)^{th}$ stage, exchanging the second signals at the $2n^{th}$ stage and the $(2n-1)^{th}$ stage, exchanging the third signals at the $2n^{th}$ stage and the $(2n-1)^{th}$ stage, and exchanging the fourth signals at the $2n^{th}$ stage and the $(2n-1)^{th}$ stage, wherein n is a natural number;
wherein the first exchanging circuit comprises a first transistor, a second transistor, a third transistor, and a fourth transistor,
wherein a control electrode of the first transistor is coupled to a first control signal terminal, wherein a first electrode of the first transistor is coupled to an output terminal of the shift register at the $(2n-1)^{th}$ stage, wherein a second electrode of the first transistor is coupled to an input terminal of the control circuit at the $(2n-1)^{th}$ stage, wherein a control electrode of the second transistor is coupled to the first control signal terminal, wherein a first electrode of the second transistor is coupled to the output terminal of the shift register at the $(2n-1)^{th}$ stage, wherein a second electrode of the second transistor is coupled to an input terminal of the control circuit at the $2n^{th}$ stage, wherein a control electrode of the third transistor is coupled to the first control signal terminal, wherein a first electrode of the third transistor is coupled to an output terminal of the shift register at the $2n^{th}$ stage, wherein a second electrode of the third transistor is coupled to the input terminal of the control circuit at the $(2n-1)^{th}$ stage, wherein a control electrode of the fourth transistor is coupled to the first control signal terminal, wherein a first electrode of the fourth transistor is coupled to the output terminal of the shift register at the $2n^{th}$ stage, and wherein a second electrode of the fourth transistor is coupled to the input terminal of the control circuit at the $2n^{th}$ stage; or
wherein a control electrode of the first transistor is coupled to a first control signal terminal, wherein a first electrode of the first transistor is coupled to an output terminal of the control circuit at the $(2n-1)^{th}$ stage, wherein a second electrode of the first transistor is coupled to an input terminal of the level shifter at the $(2n-1)^{th}$ stage, wherein a control electrode of the second transistor is coupled to the first control signal terminal, wherein a first electrode of the second transistor is coupled to the output terminal of the control circuit at the $(2n-1)^{th}$ stage, wherein a second electrode of the second transistor is coupled to an input terminal of the level shifter at the $2n^{th}$ stage, wherein a control electrode of the third transistor is coupled to the first control signal terminal, wherein a first electrode of the third transistor is coupled to an output terminal of the control circuit at the $2n^{th}$ stage, wherein a second electrode of the third transistor is coupled to the input terminal of the level shifter at the $(2n-1)^{th}$ stage, wherein a control electrode of the fourth transistor is coupled to the first control signal terminal, wherein a first electrode of the fourth transistor is coupled to the output terminal of the control circuit at the $2n^{th}$ stage, and wherein a second electrode of the fourth transistor is coupled to the input terminal of the level shifter at the $2n^{th}$ stage; or wherein a control electrode of the first transistor is coupled to a first control signal terminal, wherein a first electrode of the first transistor is coupled to an output terminal of the level shifter at the $(2n-1)^{th}$ stage, wherein a second electrode of the first transistor is coupled to an input terminal of the voltage stabilization circuit at the $(2n-1)^{th}$ stage, wherein a control electrode of the second transistor is coupled to the first control signal terminal, wherein a first electrode of the second transistor is coupled to the output terminal of the level shifter at the $(2n-1)^{th}$ stage, wherein a second electrode of the second transistor is coupled to an input terminal of the voltage stabilization circuit at the $2n^{th}$ stage, wherein a control electrode of the third transistor is coupled to the first control signal terminal, wherein a first electrode of the third transistor is coupled to an output terminal of the level shifter at the $2n^{th}$ stage, wherein a second electrode of the third transistor is coupled to the input terminal of the voltage stabilization circuit at the $(2n-1)^{th}$ stage, wherein a control electrode of the fourth transistor is coupled to the first control signal terminal, wherein a first electrode of the fourth transistor is coupled to the output terminal of the level shifter at the $2n^{th}$ stage, and wherein a second electrode of the fourth transistor is coupled to the input terminal of the voltage stabilization circuit at the $2n^{th}$ stage; or wherein a control electrode of the first transistor is coupled to a first control signal terminal, wherein a first electrode of the first transistor is coupled to an output terminal of the voltage stabilization circuit at the $(2n-1)^{th}$ stage, wherein a second electrode of the first transistor is coupled to a $(2n-1)^{th}$ output terminal of the gate drive circuit, wherein a control electrode of the second transistor is coupled to the first control signal terminal, wherein a first electrode of the second transistor is coupled to the output terminal of the voltage stabilization circuit at the $(2n-1)^{th}$ stage, wherein a second electrode of the second transistor is coupled to a $2n^{th}$ output terminal of the gate drive circuit, wherein a control electrode of the third transistor is coupled to the first control signal terminal, wherein a first electrode of the third transistor is coupled to an output terminal of the voltage stabilization circuit at the $2n^{th}$ stage, wherein a second electrode of the third transistor is coupled to the $(2n-1)^{th}$ output terminal of the gate drive circuit, wherein a control electrode of the fourth transistor is coupled to the first control signal terminal, wherein a first electrode of the fourth transistor is coupled to the output terminal of the voltage stabilization circuit at the $2n^{th}$ stage, and wherein a second electrode of the fourth transistor is coupled to the $2n^{th}$ output terminal of the gate drive circuit.

12. The gate drive circuit according to claim 11, wherein the gate drive circuit further comprises a plurality of second exchanging circuits, wherein the second exchanging circuit is configured to enable any of the following: exchanging the first signals at a $2n^{th}$ stage and a $(2n+1)^{th}$ stage, exchanging the second signals at the $2n^{th}$ stage and the $(2n+1)^{th}$ stage, exchanging the third signals at the $2n^{th}$ stage and the $(2n+1)^{th}$ stage, and exchanging the fourth signals at the $2n^{th}$ stage and the $(2n+1)^{th}$ stage.

13. The gate drive circuit according to claim 12, wherein the second exchanging circuit comprises a fifth transistor, a sixth transistor, a seventh transistor, and an eighth transistor, wherein a control electrode of the fifth transistor is coupled to a second control signal terminal, wherein a first electrode of the fifth transistor is coupled to an output terminal of the control circuit at the $2n^{th}$ stage, wherein a second electrode of the fifth transistor is coupled to an input terminal of the level shifter at the $2n^{th}$ stage, wherein a control electrode of the sixth transistor is coupled to the second control signal terminal, wherein a first electrode of the sixth transistor is coupled to the output terminal of the control circuit at the $2n^{th}$ stage, wherein a second electrode of the sixth transistor is coupled to an input terminal of the level shifter at the $(2n+1)^{th}$ stage, wherein a control electrode of the seventh transistor is coupled to the second control signal terminal, wherein a first electrode of the seventh transistor is coupled to an output terminal of the control circuit at the $(2n+1)^{th}$ stage, wherein a second electrode of the seventh transistor is coupled to the input terminal of the level shifter at the $2n^{th}$ stage, wherein a control electrode of the eighth transistor is coupled to the second control signal terminal, wherein a first electrode of the eighth transistor is coupled to the output terminal of the control circuit at the $(2n+1)^{th}$ stage, and wherein a second electrode of the eighth transistor is coupled to the input terminal of the level shifter at the $(2n+1)^{th}$ stage; or wherein a control electrode of the fifth transistor is coupled to a second control signal terminal, wherein a first electrode of the fifth transistor is coupled to an output terminal of the shift register at the $2n^{th}$ stage, wherein a second electrode of the fifth transistor is coupled to an input terminal of the control circuit at the $2n^{th}$ stage, wherein a control electrode of the sixth transistor is coupled to the second control signal terminal, wherein a first electrode of the sixth transistor is coupled to the output terminal of the shift register at the $2n^{th}$ stage, wherein a second electrode of the sixth transistor is coupled to an input terminal of the control circuit at the $(2n+1)^{th}$ stage, wherein a control electrode of the seventh transistor is coupled to the second control signal terminal, wherein a first electrode of the seventh transistor is coupled to an output terminal of the shift register at the $(2n+1)^{th}$ stage, wherein a second electrode of the seventh transistor is coupled to the input terminal of the control circuit at the $2n^{th}$ stage, wherein a control electrode of the eighth transistor is coupled to the second control signal terminal, wherein a first electrode of the eighth transistor is coupled to the output terminal of the shift register at the $(2n+1)^{th}$ stage, and wherein a second electrode of the eighth transistor is coupled to the input terminal of the control circuit at the $(2n+1)^{th}$ stage; or wherein a control electrode of the fifth transistor is coupled to a second control signal terminal, wherein a first electrode of the fifth transistor is coupled to an output terminal of the level shifter at the $2n^{th}$ stage, wherein a second electrode of the fifth transistor is coupled to an input terminal of the voltage stabilization circuit at the $2n^{th}$ stage, wherein a control electrode of the sixth transistor is coupled to the second control signal terminal, wherein a first electrode of the sixth transistor is coupled to the output terminal of the level shifter at the $2n^{th}$ stage, wherein a second electrode of the sixth transistor is coupled to an input terminal of the voltage stabilization circuit at the $(2n+1)^{th}$ stage, wherein a control electrode of the seventh transistor is coupled to the second control signal terminal, wherein a first electrode of the seventh transistor is coupled to an output terminal of the level shifter at the $(2n+1)^{th}$ stage, wherein a second electrode of the seventh transistor is coupled to the input terminal of the voltage stabilization circuit at the $2n^{th}$ stage, wherein a control electrode of the eighth transistor is coupled to the second control signal terminal, wherein a first electrode of the eighth transistor is coupled to the output terminal of the level shifter at the $(2n+1)^{th}$ stage, and wherein a second electrode of the eighth transistor is coupled to the input terminal of the voltage stabilization circuit at the $(2n+1)^{th}$ stage; or wherein a control electrode of the fifth transistor is coupled to a second control signal terminal, wherein a first electrode of the fifth transistor is coupled to an output terminal of the voltage stabilization circuit at the $2n^{th}$ stage, wherein a second electrode of the fifth transistor is coupled to a $2n^{th}$ output terminal of the gate drive circuit, wherein a control electrode of the sixth transistor is coupled to the second control signal terminal, wherein a first electrode of the sixth transistor is coupled to the output terminal of the voltage stabilization circuit at the $2n^{th}$ stage, wherein a second electrode of the sixth transistor is coupled to a $(2n+1)^{th}$ output terminal of the gate drive circuit, wherein a control electrode of the seventh transistor is coupled to the second control signal terminal, wherein a first electrode of the seventh transistor is coupled to an output terminal of the voltage stabilization circuit at the $(2n+1)^{th}$ stage, wherein a second electrode of the seventh transistor is coupled to the $2n^{th}$ output terminal of the gate drive circuit, wherein a control electrode of the eighth transistor is coupled to the second control signal terminal, wherein a first electrode of the eighth transistor is coupled to the output terminal of the voltage stabilization circuit at the $(2n+1)^{th}$ stage, and wherein a second electrode of the eighth transistor is coupled to the $(2n+1)^{th}$ output terminal of the gate drive circuit.

14. The gate drive circuit according to claim 13, wherein the fifth transistor and the eighth transistor are N-type transistors, and wherein the sixth transistor and the seventh transistor are P-type transistors; or
   wherein the fifth transistor and the eighth transistor are P-type transistors, and wherein the sixth transistor and the seventh transistor are N-type transistors.

15. The gate drive circuit according to claim 11, wherein the first transistor and the fourth transistor are N-type transistors, and wherein the second transistor and the third transistor are P-type transistors; or
   wherein the first transistor and the fourth transistor are P-type transistors, and wherein the second transistor and the third transistor are N-type transistors.

16. An array substrate comprising the gate drive circuit according to claim 11.

17. A display device comprising the array substrate according to claim 16.

* * * * *

UNITED STATES PATENT AND TRADEMARK OFFICE
CERTIFICATE OF CORRECTION

PATENT NO. : 11,238,826 B2
APPLICATION NO. : 16/647671
DATED : February 1, 2022
INVENTOR(S) : Chen et al.

It is certified that error appears in the above-identified patent and that said Letters Patent is hereby corrected as shown below:

In the Specification

Column 13, Line 56, "$(2n+^1)^{th}$ stage" should read -- $(2n+1)^{th}$ stage --.
Column 24, Line 51, "$(2n+^1)^{th}$ stage" should read -- $(2n+1)^{th}$ stage --.
Column 29, Line 16, "$(2n+^1)^{th}$ stage" should read -- $(2n+1)^{th}$ stage --.

In the Claims

In Claim 1, Column 31, Line 39, "circuit wherein" should read -- circuit; wherein --.
In Claim 1, Column 31, Lines 45-46, "circuit wherein" should read -- circuit; wherein --.
In Claim 1, Column 31, Line 52, "circuit and wherein" should read -- circuit; and wherein --.

Signed and Sealed this
Third Day of May, 2022

Katherine Kelly Vidal
*Director of the United States Patent and Trademark Office*